(12) United States Patent
Yoo et al.

(10) Patent No.: US 6,636,626 B1
(45) Date of Patent: Oct. 21, 2003

(54) WAFER MAPPING APPARATUS AND METHOD

(75) Inventors: Woo Sik Yoo, Palo Alto, CA (US); Kitaek Kang, Dublin, CA (US)

(73) Assignee: WaferMasters, Inc., San Jose, CA (US)

( * ) Notice: Subject to any disclaimer, the term of this patent is extended or adjusted under 35 U.S.C. 154(b) by 0 days.

(21) Appl. No.: 09/451,674

(22) Filed: Nov. 30, 1999

(51) Int. Cl.[7] .................................................. G06K 9/00
(52) U.S. Cl. ......................................... 382/151; 348/94
(58) Field of Search ................................. 382/140, 141, 382/142, 143, 144, 145, 146, 147, 148, 149, 151; 348/91, 92, 94, 95, 86; 324/755

(56) References Cited

U.S. PATENT DOCUMENTS

| | | | |
|---|---|---|---|
| 4,895,486 A | | 1/1990 | Baker et al. ................. 414/331 |
| 5,619,587 A | * | 4/1997 | Willoughby et al. ........ 356/630 |
| 5,631,976 A | * | 5/1997 | Bolle et al. ................. 358/464 |
| 5,685,684 A | | 11/1997 | Kato et al. .................. 414/217 |
| 5,771,308 A | | 6/1998 | Florent ........................ 382/130 |
| 5,909,994 A | | 6/1999 | Blum et al. .................. 414/217 |
| 6,043,502 A | * | 3/2000 | Ahn ........................... 250/559.4 |
| 6,082,949 A | * | 7/2000 | Rosenquist ................. 414/217 |
| 6,147,356 A | * | 11/2000 | Hahn et al. ............. 250/559.29 |
| 6,213,853 B1 | * | 4/2001 | Gonzalez-Martin et al. 451/287 |
| 6,356,091 B1 | * | 3/2002 | Nimtz et al. ................. 324/755 |

FOREIGN PATENT DOCUMENTS

| | | |
|---|---|---|
| JP | 01295436 A | 11/1989 |
| JP | 02135752 A | 5/1990 |
| JP | 02142157 A | 5/1990 |

* cited by examiner

Primary Examiner—Amelia M. Au
Assistant Examiner—Virginia Kibler
(74) Attorney, Agent, or Firm—MacPherson Kwok Chen & Heid LLP

(57) ABSTRACT

A wafer mapping system uses a camera to acquire an image of a carrier containing wafers. In one embodiment, the acquired image is stored as rows and columns of pixels. The presence and location of a wafer in the carrier are determined by looking for pixel intensity variations in a column of the image.

12 Claims, 8 Drawing Sheets

WAFER MAPPING APPARATUS AND METHOD

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR 1.71(e).

CROSS-REFERENCES TO APPENDICES

This patent disclosure includes Appendix A,

Appendix B, and Appendix C.

BACKGROUND OF THE INVENTION

1. Field of the Invention

The present invention generally relates to semiconductor manufacturing equipment and more particularly to systems and methods for mapping semiconductor wafers.

2. Description of the Related Art

A semiconductor manufacturing equipment is used to process semiconductor wafers into electronic devices. Typically, in this equipment, the wafers are contained in a carrier. While in the carrier, the wafers are "mapped" to determine the number of wafers to be processed and the slot location of each wafer in the carrier. Wafer mapping enables the manufacturing equipment to return a processed wafer to the original slot location from which the wafer came. Returning the wafer into its original slot location in the carrier is important because equipment operators rely on slot locations to distinguish the wafers. Knowing the number of wafers contained in the carrier is also important because the manufacturing equipment needs to know when all the wafers in the carrier have been processed to alert an equipment operator or to move the out of a load lock.

Wafer mapping has been performed using laser beams. Typically, the carrier is slowly moved in a vertical direction to cross the path of a horizontally aimed laser beam. A computer keeps track of when and how many times the wafers break the beam. By knowing the distance between the slots of the carrier, the computer can determine the number of wafers and the location of each wafer in the carrier. Because each wafer in the carrier is moved to break the beam, using a laser beam to perform wafer mapping takes time. Further, detecting a cross-slotted wafer (i.e. a single wafer which occupies two slots) is difficult using a laser beam because of the limited area which a beam can cover.

SUMMARY OF THE INVENTION

The present invention provides a method and associated apparatus for mapping semiconductor wafers and wafer-like objects contained in a carrier or container. In one embodiment, an image of a carrier containing a wafer is acquired using, for example, a video camera. The image is digitized and stored in a computer as an array (i.e. row and column) of pixels, each pixel representing a point on the image. The intensity values of all pixels in a column of the image is then extracted. Because the presence of a wafer against a contrasting background generates an intensity variation in the pixels of the acquired image, the presence of the wafer can be determined by looking for variations in pixel intensity. A cross-slotted wafer is similarly detected by extracting the intensity of all pixels in two columns of the image. When a wafer is not cross-slotted, the pixel intensity variation corresponding to the wafer occurs on the same row of the image regardless of which column is being analyzed. The row location of a pixel intensity variation for a cross-slotted wafer, however, depends on the column of the image. This is because a cross-slotted wafer, which occupies two slots in the carrier, is at an angle with respect to the plane of a slot and thus intersects the columns of the image at different rows.

The invention only needs to acquire a single image of a carrier to determine the number and location of wafers in the carrier. This allows for a fast wafer mapping system with minimal moving parts. This is in marked contrast with techniques in the prior art where each wafer in the carrier is moved vertically to break a laser beam. The single acquired image can also be used to detect cross-slotted wafers, a task which is complicated and requires multiple sensors when the laser beam technique is used.

Other uses, advantages, and variations of the present invention will be apparent to one of ordinary skill in the art upon reading this disclosure and accompanying drawings.

DETAILED DESCRIPTION

The present invention provides a method and associated apparatus for detecting semiconductor wafers and wafer-like objects contained in a carrier or container. The invention may be used in a variety of applications including in the manufacture of semiconductor devices, hard disks, and liquid crystal displays. By way of example, the invention can be used in etching, deposition, chemical-mechanical planarization, and rapid thermal processing systems.

Figure 1A:
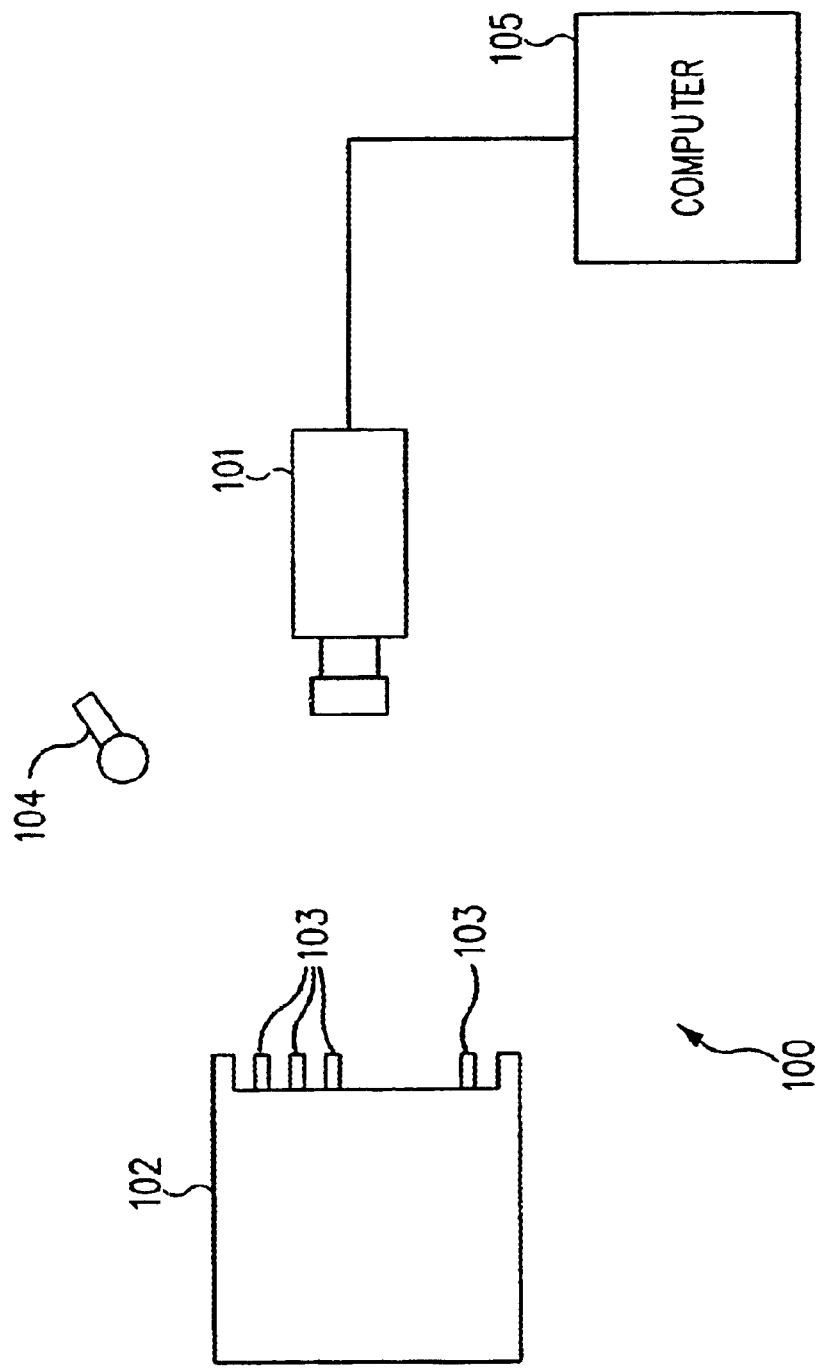
FIG. 1A shows a pictorial diagram of a wafer mapping system in accordance with the present invention.

FIG. 1A shows a pictorial diagram of a wafer mapping system 100 in accordance with the present invention. Referring to FIG. 1A, an image of wafers 103 contained in a carrier 102 is acquired using a camera 101. Carrier 102 may be a fixed or removable carrier. In this particular embodiment, camera 101 is a QUICKCAM™ Home camera from Logitech Corporation of Fremont, California. Camera 101 may also be any conventional camera such as a video camera, a photographic camera, or a digital camera. Camera 101 is positioned to have a field of view which includes all the wafers in carrier 102. Light source 104 provides lighting when system 100 is employed in a dark environment. The image acquired using camera 101 is provided to a computer 105 for subsequent image processing. If the Logitech QUICKCAM™ Home camera is used, the output of camera 101 is a digitized image which is provided to computer 105 via a Universal Serial Bus ("USB") (not shown). Otherwise, the image acquired using camera 101 is first digitized using a conventional digitizer before the image is processed in computer 105.

Figure 1C:
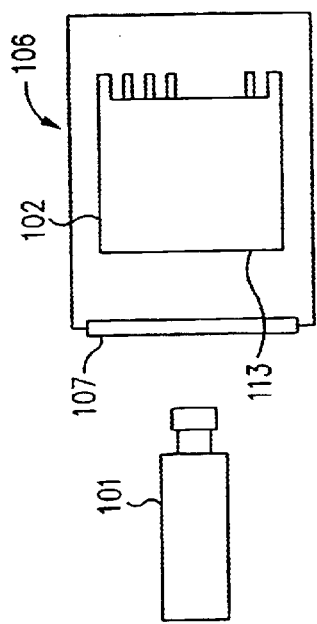
FIGS. 1B and 1C are pictorial diagrams showing possible mounting locations for the wafer mapping system shown in FIG. 1A
Figure 1B:
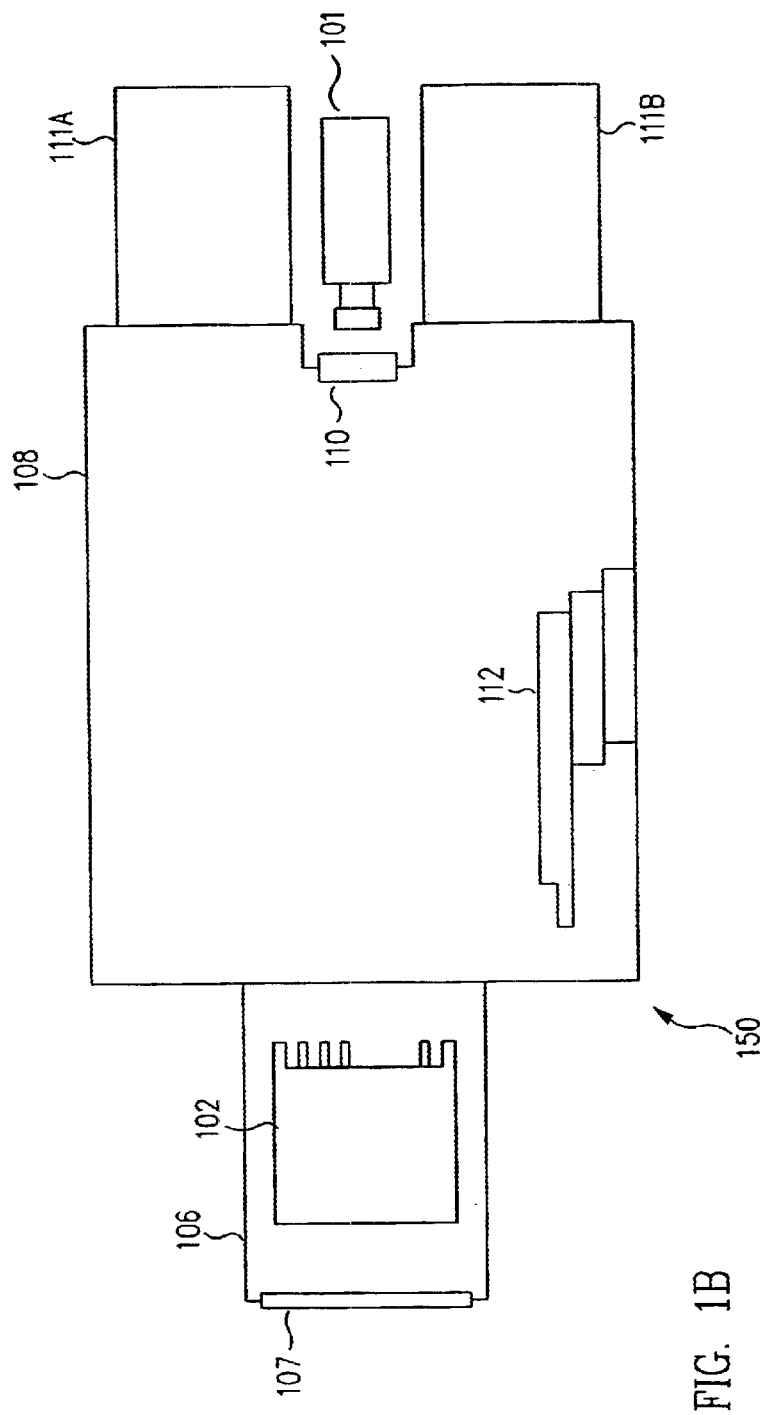

System 100 can be employed in any location of a semiconductor manufacturing equipment 150 (FIG. 1B) where wafer mapping is desired. As shown in FIG. 1B, camera 101 of system 100 may be mounted between vertically placed reactors 111A and 111B. Camera 101 acquires an image of carrier 102 through a viewing port 110 of a transfer chamber 108. Viewing port 110 is made of a transparent material such as quartz and is directly across a load lock 106 which contains carrier 102. An image of carrier 102 may be acquired using camera 101 while a robot 112 is in a lowered position. Camera 101 may also be mounted to acquire an image of carrier 102 through a viewing port 107 in the back of load lock 106 as illustrated in FIG. 1C. In FIG. 1C, carrier 102 has an open back side 113 which allows viewing of the wafers. While FIGS. 1B and 1C illustrate specific examples of how camera 101 may be positioned in a semiconductor manufacturing equipment, the invention is not so limited. For example, camera 101 does not have to be mounted directly across or at a certain distance from carrier 102. This is because once an image is acquired, conventional image processing techniques can be used (e.g. to digitally "tilt" or to "zoom" to a specific portion of the acquired image) to accommodate various camera mounting configurations and perform wafer mapping in accordance with the invention.

In one embodiment, the digitized image is stored as a bitmap. Bitmaps are known in the art. Generally, a bitmap can be thought of as an array of pixels, each pixel representing a point on the digitized image. By knowing the resolution of the bitmap, the number of pixels in each row and the number of pixels in each column of the bitmap are also known. For example, a 640×480 bitmap has 480 rows and 640 columns of pixels. In this disclosure, row 1, column 1 of a bitmap is chosen to be the upper left hand corner of the image. Appendix A shows a listing of a C++ programming language source code for extracting the red, green, and blue intensity values of all pixels in a column of a bitmap. Referring to Appendix A, a bitmap file "wafer0.bmp" (Appendix A, line 83) of an acquired image is opened for processing. Each pixel in a selected column (Appendix A, line 96) of bitmap file "wafer0.bmp" is extracted and converted to units of red, green, and blue ("RGB") intensity (Appendix A, lines 110–115). The resulting intensity values of all pixels in the selected column are written to a temporary data file "test.dat" (Appendix A, lines 101, 119–120). File "test.dat" can be loaded into a spreadsheet or application program for further processing. The invention can be performed using any pixel or image format. For example, each pixel in the selected column can also be converted to the so-called HSV format (Appendix A, lines 117, 131–164). Further, pixel unit values (e.g. intensity values) may be scaled and normalized to improve the contrast between a wafer and its background.

Figure 2:
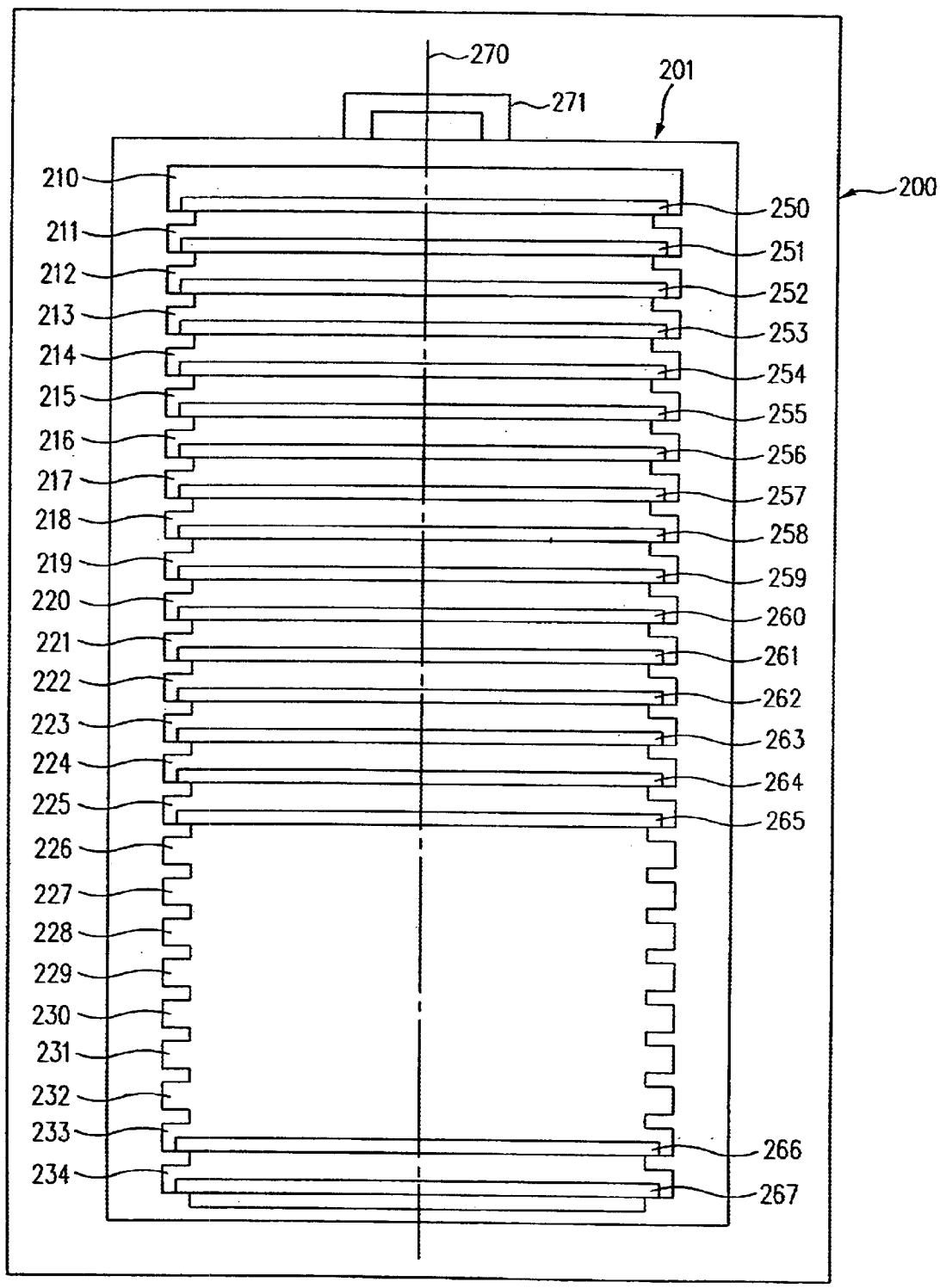
FIG. 2 shows an image of a wafer carrier mapped in accordance with the present invention.
Figure 3:
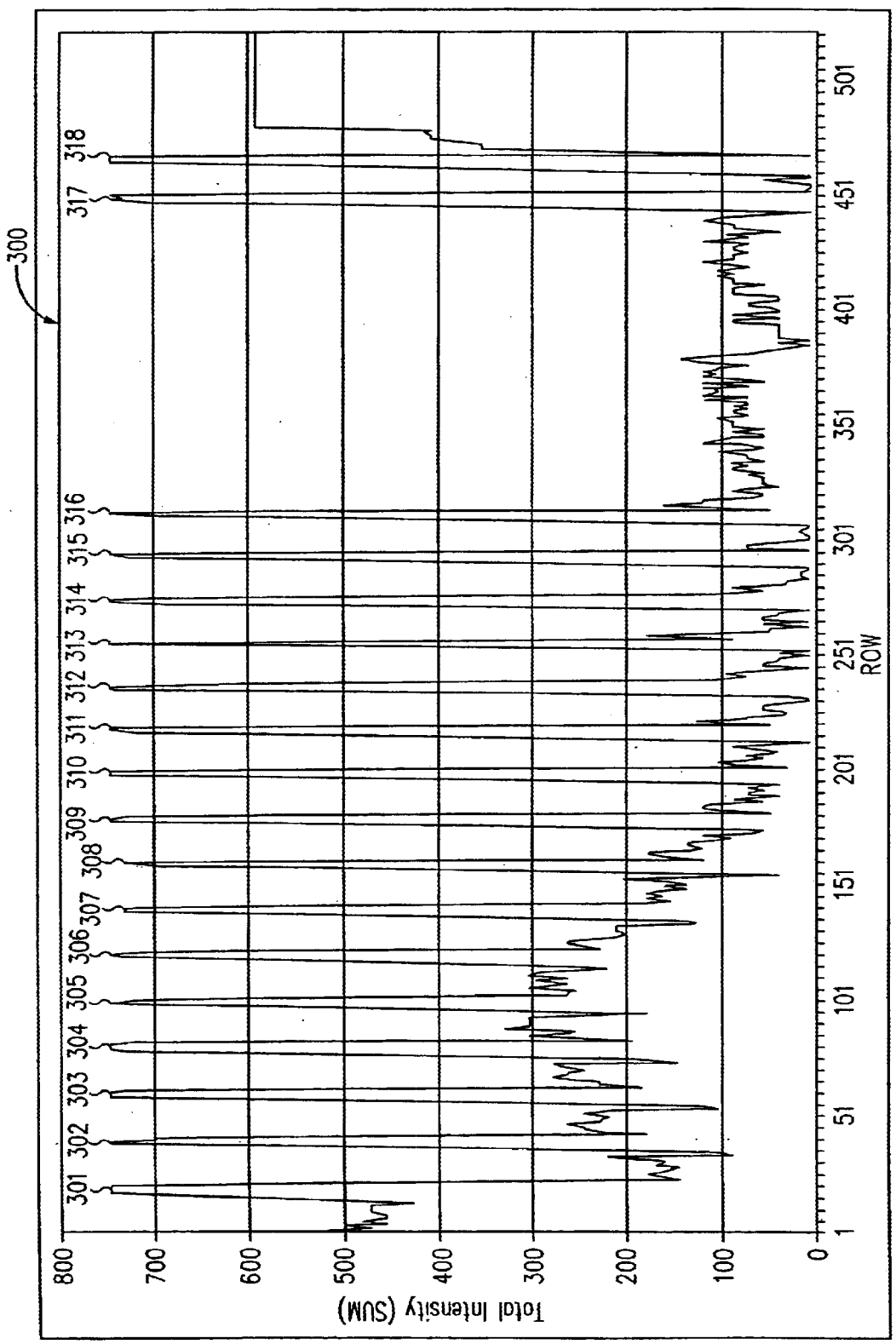
FIG. 3 shows a plot of total intensity versus row location for pixels in a column of the image shown in FIG. 2.

Appendix B shows a table (in spreadsheet format) containing the RGB intensity values of pixels along a line 270 which represents a column of an image 200 (FIG. 2). The intensity values in Appendix B are imported (i.e. taken) from a data file such as "test.dat" described above. The numbers under the columns "R", "G", and "B" indicate the values of the red, green, and blue intensities for each pixel along line 270 (FIG. 2). The unit for red, green, and blue is an arbitrary unit representing intensity and can be scaled or normalized depending on the specific application. The numbers under the column "SUM" indicate the total of the red, green, and blue intensities for a particular pixel. For example, the first row of numbers in Appendix B indicates that on the first row of image 200 (row 1), a pixel which lies on line 270 has 173 units of red, 174 units of green, and 173 units of blue for a total intensity (or SUM) of 520 units (i.e. 173+174+173). FIG. 3 shows a plot 300 of the total intensity versus row location for each pixel along line 270 of image 200.

As shown in FIG. 2, image 200 is an image of a carrier 201. Carrier 201 is a 25-slot wafer carrier having slots 210 to 234. Slot 210 has a wafer 250, slot 211 has a wafer 251, slot 212 has a wafer 252, and so on. Slots 226 to 232 do not have wafers in them. Comparing carrier 201 to plot 300 (FIG. 3), each wafer in carrier 201 has a corresponding pixel peak intensity. Wafer 250 corresponds to a peak 301 in plot 300, wafer 251 corresponds to a peak 302 in plot 300, and so on. This is because a wafer against a contrasting background varies a pixel's intensity. Thus, the presence or absence of a wafer can be determined by looking for peak intensities. A peak intensity can be detected using conventional signal processing techniques such as by setting a threshold. In plot 300 (FIG. 3), for example, any pixel having a total intensity value greater than 600 units (the threshold) indicates the presence of a peak and, thus, the presence of a wafer in the carrier.

A calibration procedure is performed to discriminate "background noise" and to determine the distance between slots (also known as "pitch") for specific applications. Calibration is performed by acquiring and analyzing images of full and partially-filled carriers. For example, the image of a full carrier can be acquired to determine the number of pixel rows between slots. In plot 300 (FIG. 3), peak 301, which corresponds to wafer 250 in slot 210 (FIG. 2), occurs at about row 16. Thus, rows prior to row 16 represent background noise, such as a handle 271 (FIG. 2), and can be ignored by the wafer mapping system. The row corresponding to slot 210, the first slot from the top of carrier 201, is right after the rows corresponding to the background noise. In plot 300, the peaks corresponding to wafers in adjacent slots occur approximately every 18 rows. For example, slot 211 is approximately 18 rows away from slot 210, slot 212 is approximately 36 rows away from slot 210, and so on.

Thus, there are approximately 18 rows between slots. Using the above information, wafers 266–267 in slots 233–234 (FIG. 2), which correspond to peaks 317 and 318 in rows 449 and 467 (FIG. 3), can be detected. Missing wafers in slots 226 to 232, which correspond to the absence of peaks between rows 315 and 445, are also similarly determined.

Depending on the specific wafer mapping system and setup employed, a pixel's red, green, or blue intensity value may be used instead of the total intensity. Other formats for representing images, such as the HSV format, and intensity information from "black and white" cameras may also be used. Further, peaks may be detected using any conventional signal processing technique, including by inspection. Although the invention is illustrated by detecting peak intensity, other image signal components which are distinguishable as indicating a feature of a wafer may also be used.

Figure 4:
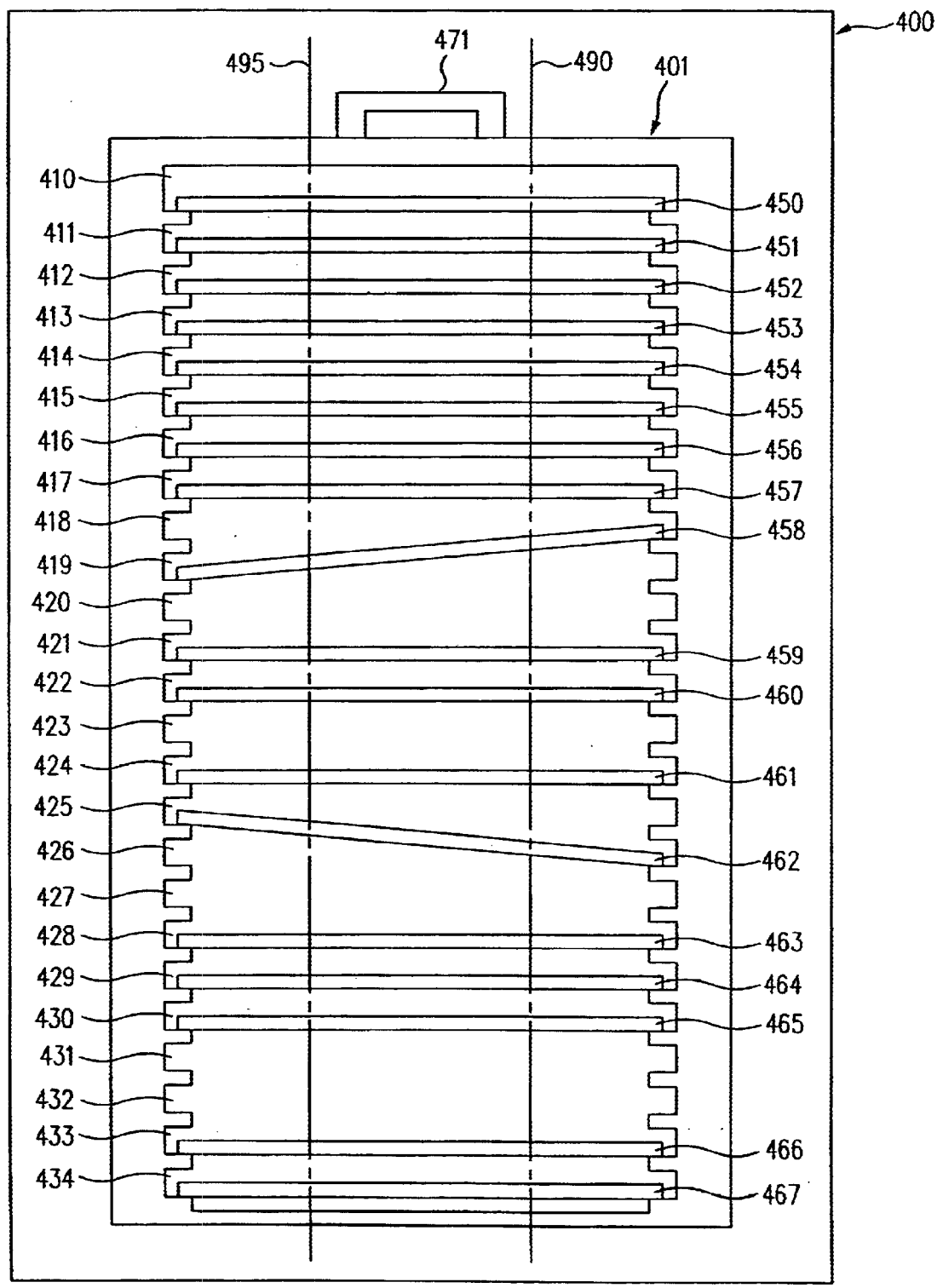
FIG. 4 shows an image of a wafer carrier containing cross-slotted wafers.
Figure 5:
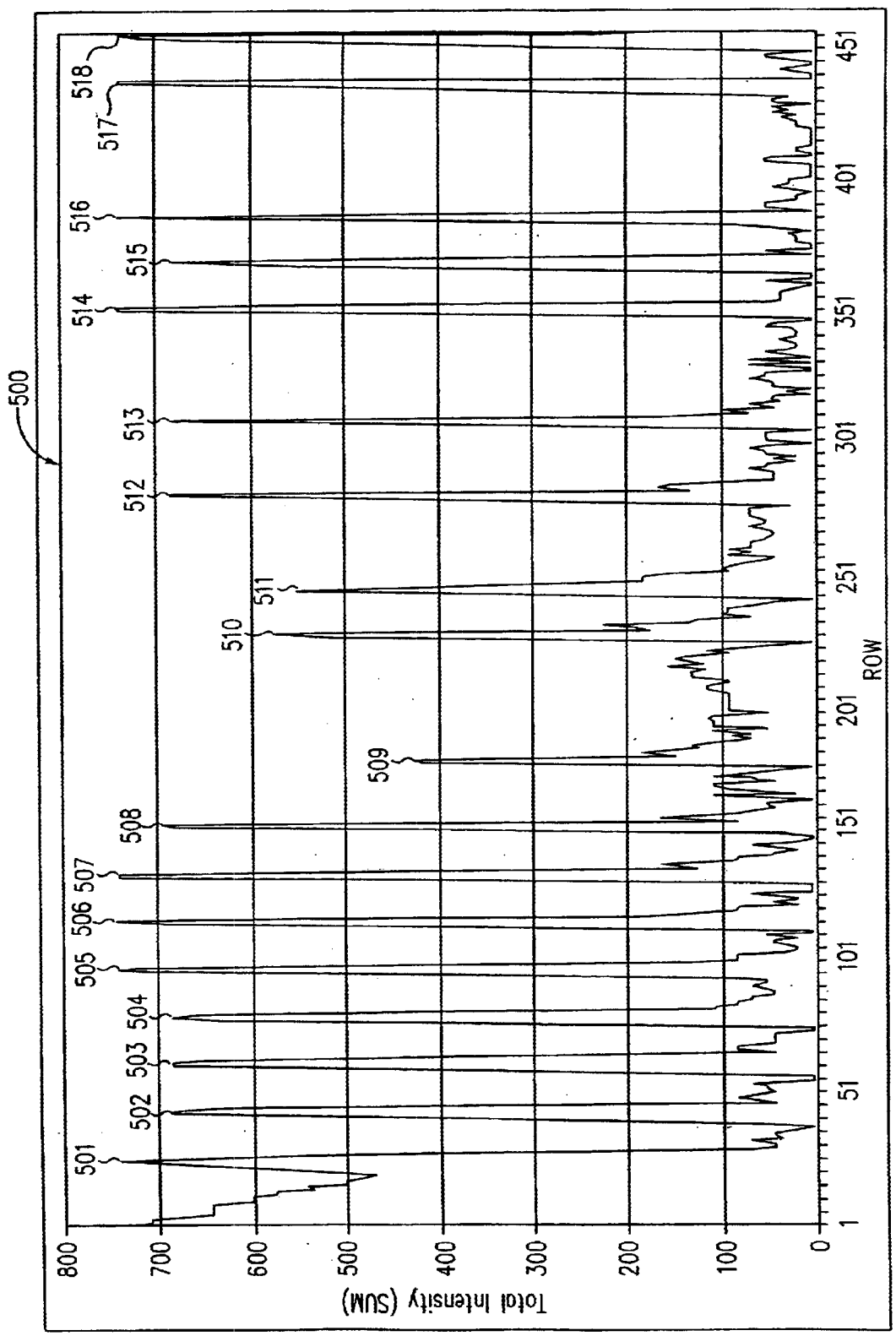
FIG. 5 shows a plot of total intensity versus row location for pixels in a column of the image shown in FIG. 4.
Figure 6:
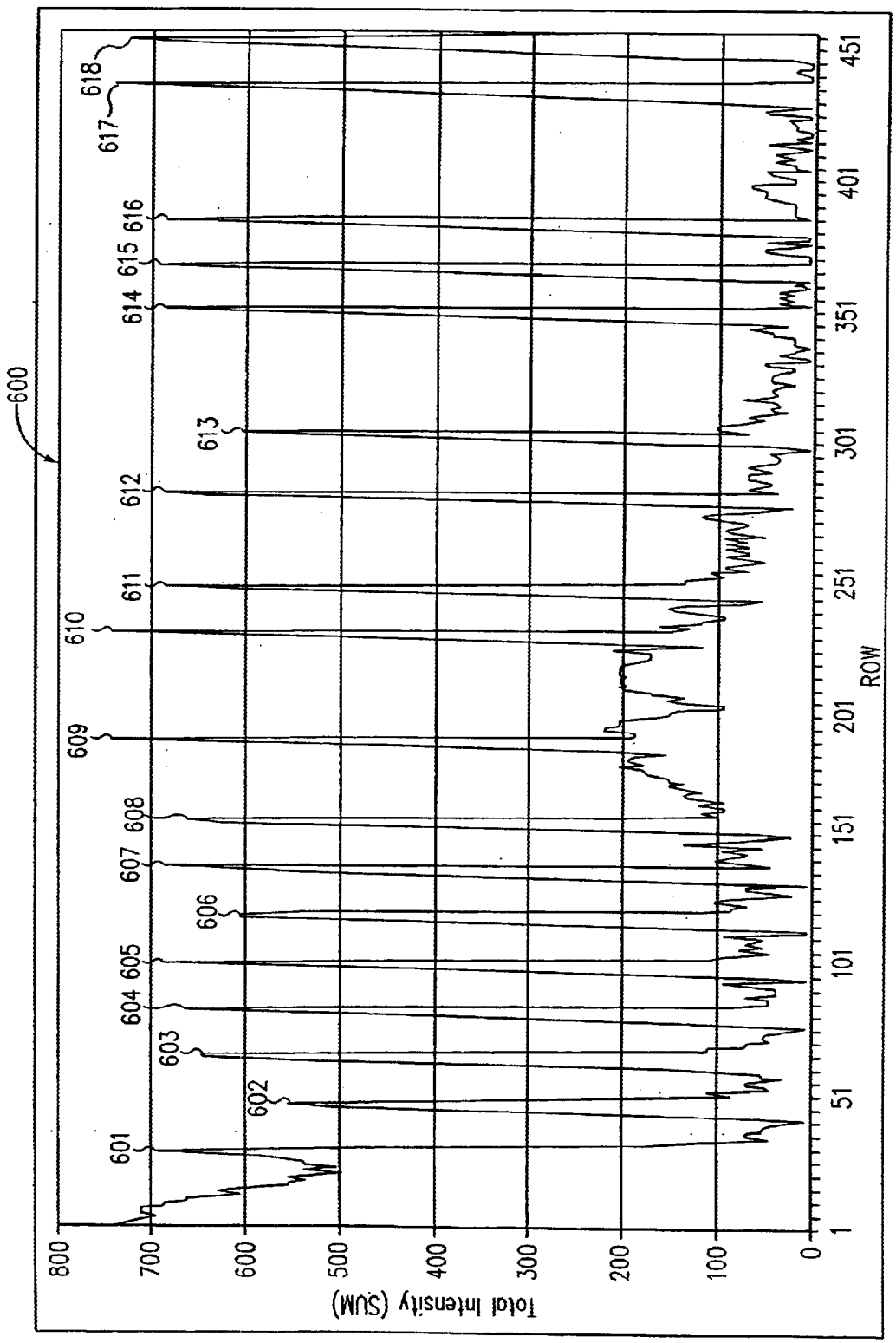
FIG. 6 shows a plot of total intensity versus row location for pixels in another column of the image shown in FIG. 4.

By taking the intensity values of pixels in two rows of an image, a cross-slotted wafer in a carrier can be detected. In FIG. 4, a line 495 and a line 490 represent two columns of an image 400. Image 400 is an image of a carrier 401 which is a 25-slot carrier having slots 410–434. Carrier 401 contains wafers 450–467, of which wafer 458 and wafer 462 are cross-slotted. Appendix C shows a table containing red (R) intensity, green (G) intensity, blue (B) intensity, and total intensity (SUM) of pixels along line 490. A plot 500, shown in FIG. 5, is a plot of the total intensity versus row location for each pixel along line 490. Appendix C also shows a table containing red (R) intensity, green (G) intensity, blue (B) intensity, and total intensity (SUM) of pixels along line 495. A plot of total intensity versus row location for pixels along line 495 is shown in FIG. 6 as plot 600. By detecting peak intensities and by knowing the number of pixel rows between the slots of carrier 401, the presence or absence of a wafer in a specific slot can be determined as described above. Table 1 below shows the correspondence between the wafers in carrier 401 and the peaks in plot 500 and plot 600.

TABLE 1

| WAFER (FIG. 4) | SLOT (FIG. 4) | PEAK (FIG. 5) | PEAK (FIG. 6) |
|---|---|---|---|
| 450 | 410 | 501 | 601 |
| 451 | 411 | 502 | 602 |
| 452 | 412 | 503 | 603 |
| 453 | 413 | 504 | 604 |
| 454 | 414 | 505 | 605 |
| 455 | 415 | 506 | 606 |
| 456 | 416 | 507 | 607 |
| 457 | 417 | 508 | 608 |

TABLE 1-continued

| WAFER (FIG. 4) | SLOT (FIG. 4) | PEAK (FIG. 5) | PEAK (FIG. 6) |
|---|---|---|---|
| 458 | Cross-slotted between slots 418 and 419 | 509 | 609 |
| 459 | 421 | 510 | 610 |
| 460 | 422 | 511 | 611 |
| 461 | 424 | 512 | 612 |
| 462 | Cross-Slotted between slots 425 and 426 | 513 | 613 |
| 463 | 428 | 514 | 614 |
| 464 | 429 | 515 | 615 |
| 465 | 430 | 516 | 616 |
| 466 | 433 | 517 | 617 |
| 467 | 434 | 518 | 618 |

Figure 7:
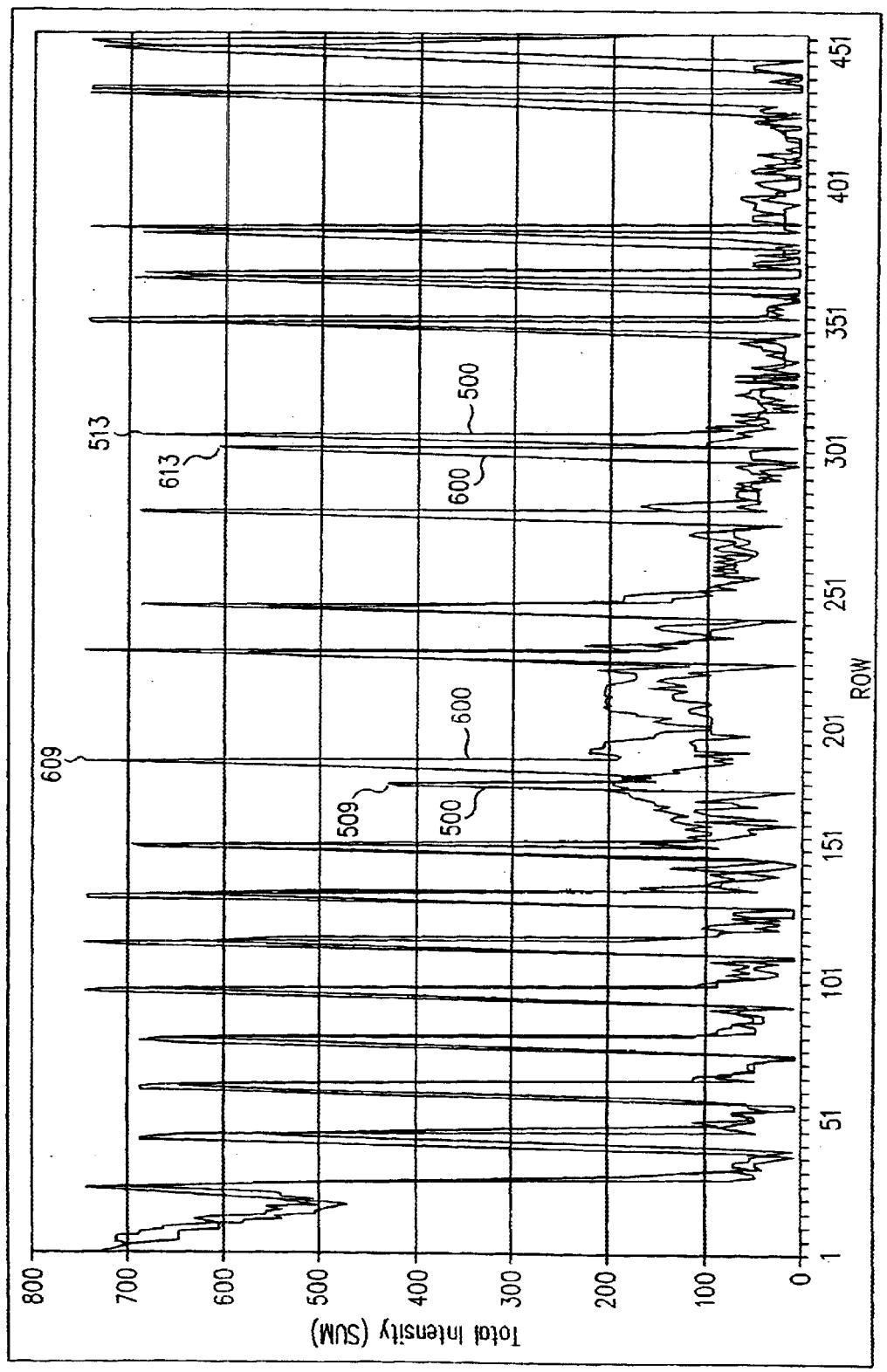
FIG. 7 shows the plot shown in FIG. 5 superimposed on the plot shown in FIG. 6.

Using the total intensity values of pixels along line 490 and line 495 on image 400 (FIG. 4), cross-slotted wafers are detected by comparing the rows where the peaks occur. As shown in FIG. 7, which shows plot 500 superimposed on plot 600, peaks corresponding to wafers that are not cross-slotted occur at approximately the same row. For cross-slotted wafers, however, the peaks occur at different rows. Peak 509, which corresponds to cross-slotted wafer 458, occurs at row 178 in plot 500 whereas peak 609, which corresponds to the same wafer 458, occurs at row 183 in plot 600. Similarly, for cross-slotted wafer 462, peak 513 occurs at row 308 in plot 500 while peak 613 occurs at row 303 in plot 600. Thus, cross-slotted wafers can be detected by looking for shifts in peak row locations for the same wafer. These shifts can be detected using a variety of conventional methods including by direct comparison of peak row locations. Conventional signal processing techniques may also be used.

Because the invention employs image acquisition processing techniques, the invention provides a fast wafer mapping system with minimal moving parts. This is in marked contrast with wafer mapping systems in the prior art where each wafer in a carrier is moved vertically to break a laser beam. The invention can also be used to detect cross-slotted wafers, a task which is complicated and requires multiple sensors when conventional laser beam techniques are used. By feeding the output of the wafer mapping camera to a display, an operator can also remotely monitor the status of the wafers in the carrier.

The description of the invention given above is provided for purposes of illustration and is not intended to be limiting. The invention is set forth in the following claims.

APPENDIX A

```
//© 1999 WaferMasters Incorporated

// WaferMappingDlg.cpp : implementation file
// include "stdio.h"
include "stdafx.h"
#include "WaferMapping.h"
#include "WaferMappingDlg.h"

#ifdef _DEBUG
#define new DEBUG_NEW
#undef THIS_FILE
static char THIS_FILE[] = __FILE__;
endif /////////////////////////////////////////////////////////////////////////////
// CWaferMappingDlg dialog CWaferMappingDlg::CWaferMappingDlg(CWnd* pParent /*=NULL*/)
    : CDialog(CWaferMappingDlg::IDD, pParent)
{
    //{{AFX_DATA_INIT(CWaferMappingDlg)
        // NOTE: the ClassWizard will add member initialization here
    //}}AFX_DATA_INIT
    // Note that LoadIcon does not require a subsequent DestroyIcon in Win32
    m_hIcon = AfxGetApp()->LoadIcon(IDR_MAINFRAME);
} void CWaferMappingDlg::DoDataExchange(CDataExchange* pDX)
{
    CDialog::DoDataExchange(pDX);
    //{{AFX_DATA_MAP(CWaferMappingDlg)
        // NOTE: the ClassWizard will add DDX and DDV calls here
    //}}AFX_DATA_MAP
}

BEGIN_MESSAGE_MAP(CWaferMappingDlg, CDialog)
    //{{AFX_MSG_MAP(CWaferMappingDlg)
    ON_WM_QUERYDRAGICON()
    ON_WM_PAINT()
    ON_WM_LBUTTONUP()
    //}}AFX_MSG_MAP
END_MESSAGE_MAP()

/////////////////////////////////////////////////////////////////////////////
// CWaferMappingDlg message handlers BOOL CWaferMappingDlg::OnInitDialog()
{
    CDialog::OnInitDialog();

// Set the icon for this dialog. The framework does this automatically
    //  when the application's main window is not a dialog
    SetIcon(m_hIcon, TRUE);         // Set big icon
    SetIcon(m_hIcon, FALSE);        // Set small icon
```

```
              // TODO: Add extra initialization here
60
              return TRUE;  // return TRUE  unless you set the focus to a control
       }

// If you add a minimize button to your dialog, you will need the code below
65     // to draw the icon. For MFC applications using the document/view model,
       // this is automatically done for you by the framework.

70     // The system calls this to obtain the cursor to display while the user drags
       // the minimized window.
       HCURSOR CWaferMappingDlg::OnQueryDragIcon()
       {
              return (HCURSOR) m_hIcon;
75     } void CWaferMappingDlg::OnPaint()
       {
80            CPaintDC dc(this); // device context for painting // TODO: Add your message handler code here
              myBitmap.Load("wafer0.bmp");
              myBitmap.Draw (&dc);
85
              // Do not call CDialog::OnPaint() for painting messages
       } void CWaferMappingDlg::OnLButtonUp(UINT nFlags, CPoint point)
90     {
              // TODO: Add your message handler code here and/or call default
              CRect rect;
              GetClientRect(&rect);

95            CDC* pDC = GetDC();
              int x = point.x;
              COLORREF pointColor;

CFile f;
100           CFileException e;
              char* pFileName = "test.dat";
              if( !f.Open( pFileName, CFile::modeCreate | CFile::modeWrite, &e ) )
                 {
                   afxDump << "File could not be opened " << e.m_cause << "\n";
105              } char dline[30];
              int nR, nG, nB, nH, nS, nV;

110           for (int y = 0; y < rect.bottom ; y++)
              {
                     pointColor = pDC->GetPixel (x,y);
```

```
            nR = (pointColor &  0x000000ff) ;
            nG = ((pointColor >> 8) & 0x000000ff);
115         nB = ((pointColor >> 16 ) & 0x000000ff);

RGB2HSV(nR, nG, nB, &nH, &nS, &nV);

sprintf(dline, "%3d, %3d, %3d\n" + NULL, nH, nS, nV);
120         f.Write(dline, 14);
        } f.Close ();

125         CDialog::OnLButtonUp(nFlags, point);
    } define mid(a, b, c) \
            (a >= b && a <= c ? a : ( b >= a && b <= c ? b : c))
130
    void CWaferMappingDlg::RGB2HSV(int nRed, int nGreen, int nBlue, int *nH, int *nS, int *nV)
    {
        int nLow, nMid, nHigh;

135     if (nRed == nGreen &&
                nGreen == nBlue){
            *nH = 0;
            *nS = 0;
            *nV = nRed;
140         return;
        } nLow = min (nRed, min(nGreen, nBlue));
        nHigh = max (nRed, max(nGreen, nBlue));
145     nMid = mid (nRed, nGreen, nBlue);

*nV = (nLow + nHigh) / 2;
        *nS = nHigh - nLow;

150     int nCommon = (int)( 60.0 * (double) (nMid -nLow) / (double) (nHigh -nLow));

if (nRed == nLow && nBlue == nHigh)
                *nH = 240 - nCommon;
        else if (nRed == nLow && nGreen == nHigh)
155             *nH = 120 + nCommon;
        else if (nGreen == nLow && nRed == nHigh)
                *nH = 360 - nCommon;
        else if (nGreen == nLow && nBlue == nHigh)
                *nH = 240 - nCommon;
160     else if (nBlue == nLow && nGreen == nHigh)
                *nH = 120 -nCommon;
        else if (nBlue == nLow && nRed == nHigh)
                *nH = nCommon;
    }
```

A 3/3

APPENDIX B

| R | G | B | SUM |
|---|---|---|---|
| 173 | 174 | 173 | 520 |
| 156 | 166 | 148 | 470 |
| 173 | 158 | 165 | 496 |
| 173 | 150 | 132 | 455 |
| 173 | 166 | 140 | 479 |
| 173 | 150 | 132 | 455 |
| 173 | 150 | 132 | 455 |
| 173 | 150 | 132 | 455 |
| 173 | 150 | 148 | 471 |
| 173 | 150 | 148 | 471 |
| 173 | 150 | 148 | 471 |
| 173 | 150 | 148 | 471 |
| 156 | 105 | 165 | 426 |
| 206 | 182 | 165 | 553 |
| 214 | 207 | 214 | 635 |
| 247 | 247 | 247 | 741 |
| 247 | 247 | 247 | 741 |
| 247 | 247 | 247 | 741 |
| 247 | 247 | 247 | 741 |
| 231 | 223 | 239 | 693 |
| 189 | 174 | 222 | 585 |
| 115 | 113 | 156 | 384 |
| 57 | 48 | 90 | 195 |
| 49 | 40 | 57 | 146 |
| 41 | 32 | 90 | 163 |
| 41 | 48 | 90 | 179 |
| 49 | 48 | 66 | 163 |
| 33 | 56 | 66 | 155 |
| 49 | 48 | 49 | 146 |
| 57 | 48 | 66 | 171 |
| 66 | 40 | 57 | 163 |
| 66 | 40 | 57 | 163 |
| 74 | 73 | 74 | 221 |
| 33 | 16 | 41 | 90 |
| 33 | 48 | 24 | 105 |
| 198 | 207 | 214 | 619 |
| 247 | 247 | 247 | 741 |
| 247 | 247 | 247 | 741 |
| 231 | 223 | 239 | 693 |
| 231 | 223 | 239 | 693 |
| 198 | 174 | 239 | 611 |
| 140 | 97 | 165 | 402 |
| 66 | 16 | 99 | 181 |
| 66 | 56 | 107 | 229 |
| 74 | 65 | 107 | 246 |
| 74 | 81 | 90 | 245 |
| 74 | 81 | 107 | 262 |
| 74 | 65 | 90 | 229 |
| 74 | 65 | 90 | 229 |
| 57 | 73 | 90 | 220 |
| 74 | 65 | 107 | 246 |
| 74 | 65 | 90 | 229 |
| 57 | 65 | 90 | 212 |
| 33 | 32 | 41 | 106 |
| 33 | 48 | 41 | 122 |
| 198 | 199 | 189 | 586 |
| 247 | 247 | 247 | 741 |
| 247 | 247 | 247 | 741 |
| 247 | 247 | 247 | 741 |
| 231 | 239 | 239 | 709 |
| 198 | 207 | 214 | 619 |
| 132 | 113 | 148 | 393 |
| 57 | 40 | 90 | 187 |
| 66 | 56 | 107 | 229 |
| 74 | 65 | 90 | 229 |
| 74 | 81 | 107 | 262 |
| 90 | 81 | 107 | 278 |
| 74 | 81 | 107 | 262 |
| 74 | 81 | 107 | 262 |
| 74 | 81 | 90 | 245 |
| 74 | 81 | 90 | 245 |
| 74 | 97 | 99 | 270 |

B 1/8

| | | | |
|---|---|---|---|
| 90 | 81 | 107 | 278 |
| 49 | 48 | 49 | 146 |
| 57 | 73 | 57 | 187 |
| 181 | 199 | 181 | 561 |
| 231 | 247 | 247 | 725 |
| 247 | 247 | 247 | 741 |
| 247 | 247 | 247 | 741 |
| 247 | 247 | 247 | 741 |
| 231 | 239 | 239 | 709 |
| 156 | 174 | 165 | 495 |
| 57 | 65 | 74 | 196 |
| 74 | 81 | 90 | 245 |
| 90 | 97 | 115 | 302 |
| 74 | 81 | 107 | 262 |
| 57 | 81 | 115 | 253 |
| 90 | 97 | 140 | 327 |
| 90 | 97 | 115 | 302 |
| 90 | 97 | 115 | 302 |
| 90 | 97 | 115 | 302 |
| 90 | 97 | 115 | 302 |
| 90 | 105 | 107 | 302 |
| 57 | 73 | 74 | 204 |
| 49 | 89 | 41 | 179 |
| 198 | 199 | 165 | 562 |
| 214 | 231 | 222 | 667 |
| 247 | 247 | 247 | 741 |
| 231 | 247 | 247 | 725 |
| 231 | 223 | 239 | 693 |
| 173 | 182 | 198 | 553 |
| 115 | 134 | 156 | 405 |
| 74 | 81 | 107 | 262 |
| 74 | 81 | 107 | 262 |
| 57 | 81 | 115 | 253 |
| 90 | 97 | 115 | 302 |
| 74 | 81 | 107 | 262 |
| 74 | 81 | 107 | 262 |
| 90 | 81 | 123 | 294 |
| 74 | 81 | 107 | 262 |
| 90 | 97 | 115 | 302 |
| 90 | 81 | 123 | 294 |
| 90 | 81 | 107 | 278 |
| 57 | 73 | 90 | 220 |
| 74 | 105 | 66 | 245 |
| 90 | 105 | 107 | 302 |
| 156 | 174 | 165 | 495 |
| 231 | 247 | 247 | 725 |
| 247 | 247 | 247 | 741 |
| 231 | 247 | 247 | 725 |
| 214 | 207 | 214 | 635 |
| 156 | 174 | 165 | 495 |
| 74 | 65 | 90 | 229 |
| 74 | 81 | 90 | 245 |
| 74 | 81 | 107 | 262 |
| 74 | 81 | 107 | 262 |
| 74 | 65 | 107 | 246 |
| 57 | 65 | 90 | 212 |
| 57 | 56 | 90 | 203 |
| 57 | 56 | 90 | 203 |
| 57 | 65 | 90 | 212 |
| 57 | 65 | 90 | 212 |
| 57 | 65 | 90 | 212 |
| 16 | 56 | 57 | 129 |
| 16 | 56 | 57 | 129 |
| 49 | 113 | 99 | 261 |
| 140 | 166 | 181 | 487 |
| 231 | 247 | 247 | 725 |
| 231 | 247 | 247 | 725 |
| 231 | 239 | 239 | 709 |
| 173 | 182 | 198 | 553 |
| 140 | 134 | 173 | 447 |
| 41 | 48 | 90 | 179 |
| 33 | 56 | 66 | 155 |
| 41 | 48 | 90 | 179 |

| | | | |
|---|---|---|---|
| 49 | 48 | 66 | 163 |
| 41 | 48 | 90 | 179 |
| 57 | 48 | 66 | 171 |
| 33 | 48 | 57 | 138 |
| 49 | 48 | 66 | 163 |
| 33 | 48 | 57 | 138 |
| 49 | 48 | 66 | 163 |
| 57 | 73 | 74 | 204 |
| 33 | 32 | 41 | 106 |
| 16 | 16 | 8 | 40 |
| 99 | 105 | 107 | 311 |
| 173 | 174 | 173 | 520 |
| 239 | 239 | 214 | 692 |
| 231 | 247 | 247 | 725 |
| 214 | 231 | 222 | 667 |
| 74 | 81 | 107 | 262 |
| 33 | 40 | 49 | 122 |
| 33 | 56 | 66 | 155 |
| 41 | 48 | 90 | 179 |
| 41 | 48 | 90 | 179 |
| 16 | 56 | 57 | 129 |
| 24 | 48 | 49 | 121 |
| 33 | 56 | 49 | 138 |
| 33 | 48 | 57 | 138 |
| 33 | 32 | 41 | 106 |
| 33 | 32 | 24 | 89 |
| 33 | 40 | 49 | 122 |
| 16 | 32 | 24 | 72 |
| 16 | 16 | 24 | 56 |
| 16 | 32 | 24 | 72 |
| 173 | 174 | 173 | 520 |
| 247 | 247 | 247 | 741 |
| 247 | 247 | 247 | 741 |
| 231 | 247 | 247 | 725 |
| 214 | 207 | 214 | 635 |
| 57 | 73 | 74 | 204 |
| 0 | 8 | 41 | 49 |
| 24 | 40 | 41 | 105 |
| 33 | 40 | 49 | 122 |
| 33 | 40 | 49 | 122 |
| 24 | 40 | 41 | 105 |
| 16 | 16 | 24 | 56 |
| 24 | 24 | 41 | 89 |
| 16 | 16 | 8 | 40 |
| 16 | 32 | 24 | 72 |
| 16 | 32 | 24 | 72 |
| 16 | 16 | 24 | 56 |
| 16 | 32 | 24 | 72 |
| 16 | 16 | 8 | 40 |
| 33 | 32 | 24 | 89 |
| 181 | 199 | 181 | 561 |
| 247 | 247 | 247 | 741 |
| 247 | 247 | 247 | 741 |
| 247 | 247 | 247 | 741 |
| 206 | 215 | 239 | 660 |
| 57 | 73 | 90 | 220 |
| 0 | 16 | 16 | 32 |
| 24 | 24 | 41 | 89 |
| 24 | 40 | 41 | 105 |
| 8 | 24 | 41 | 73 |
| 0 | 40 | 16 | 56 |
| 8 | 24 | 41 | 73 |
| 0 | 32 | 16 | 48 |
| 0 | 24 | 16 | 40 |
| 16 | 32 | 24 | 72 |
| 24 | 24 | 41 | 89 |
| 0 | 24 | 16 | 40 |
| 0 | 0 | 8 | 8 |
| 74 | 97 | 99 | 270 |
| 173 | 174 | 173 | 520 |
| 231 | 239 | 239 | 709 |
| 247 | 247 | 247 | 741 |
| 247 | 247 | 247 | 741 |

| | | | |
|---|---|---|---|
| 115 | 113 | 140 | 368 |
| 0 | 8 | 41 | 49 |
| 8 | 40 | 49 | 97 |
| 16 | 56 | 57 | 129 |
| 8 | 24 | 41 | 73 |
| 8 | 24 | 41 | 73 |
| 0 | 16 | 16 | 32 |
| 0 | 16 | 16 | 32 |
| 16 | 16 | 24 | 56 |
| 16 | 16 | 24 | 56 |
| 16 | 16 | 24 | 56 |
| 0 | 16 | 0 | 16 |
| 0 | 0 | 8 | 8 |
| 0 | 0 | 8 | 8 |
| 0 | 16 | 16 | 32 |
| 115 | 134 | 140 | 389 |
| 247 | 247 | 247 | 741 |
| 247 | 247 | 247 | 741 |
| 239 | 223 | 206 | 668 |
| 198 | 182 | 189 | 569 |
| 132 | 113 | 123 | 368 |
| 33 | 40 | 49 | 122 |
| 8 | 40 | 49 | 97 |
| 8 | 24 | 41 | 73 |
| 8 | 40 | 49 | 97 |
| 8 | 24 | 41 | 73 |
| 0 | 16 | 16 | 32 |
| 0 | 0 | 8 | 8 |
| 16 | 16 | 24 | 56 |
| 16 | 16 | 24 | 56 |
| 16 | 16 | 8 | 40 |
| 16 | 16 | 8 | 40 |
| 0 | 0 | 8 | 8 |
| 16 | 16 | 8 | 40 |
| 0 | 0 | 8 | 8 |
| 140 | 134 | 107 | 381 |
| 247 | 247 | 247 | 741 |
| 239 | 239 | 214 | 692 |
| 173 | 182 | 198 | 553 |
| 33 | 16 | 41 | 90 |
| 33 | 16 | 41 | 90 |
| 41 | 48 | 90 | 179 |
| 24 | 24 | 41 | 89 |
| 0 | 8 | 41 | 49 |
| 0 | 8 | 41 | 49 |
| 0 | 0 | 8 | 8 |
| 16 | 16 | 24 | 56 |
| 0 | 0 | 8 | 8 |
| 16 | 16 | 24 | 56 |
| 16 | 16 | 24 | 56 |
| 16 | 16 | 8 | 40 |
| 16 | 16 | 8 | 40 |
| 0 | 0 | 8 | 8 |
| 74 | 73 | 74 | 221 |
| 231 | 231 | 214 | 676 |
| 247 | 247 | 247 | 741 |
| 247 | 247 | 247 | 741 |
| 231 | 231 | 214 | 676 |
| 156 | 158 | 165 | 479 |
| 49 | 24 | 49 | 122 |
| 33 | 16 | 41 | 90 |
| 16 | 16 | 24 | 56 |
| 24 | 24 | 41 | 89 |
| 16 | 16 | 24 | 56 |
| 0 | 16 | 16 | 32 |
| 0 | 16 | 16 | 32 |
| 0 | 0 | 8 | 8 |
| 0 | 16 | 0 | 16 |
| 0 | 16 | 0 | 16 |
| 0 | 16 | 0 | 16 |
| 0 | 0 | 8 | 8 |
| 0 | 0 | 8 | 8 |
| 99 | 113 | 107 | 319 |

| | | | |
|---|---|---|---|
| 181 | 199 | 181 | 561 |
| 231 | 247 | 247 | 725 |
| 247 | 247 | 247 | 741 |
| 231 | 223 | 239 | 693 |
| 74 | 81 | 107 | 262 |
| 0 | 0 | 8 | 8 |
| 8 | 24 | 41 | 73 |
| 8 | 24 | 41 | 73 |
| 0 | 8 | 41 | 49 |
| 0 | 16 | 16 | 32 |
| 0 | 0 | 8 | 8 |
| 0 | 0 | 8 | 8 |
| 0 | 0 | 8 | 8 |
| 0 | 16 | 0 | 16 |
| 0 | 16 | 0 | 16 |
| 0 | 0 | 8 | 8 |
| 0 | 0 | 8 | 8 |
| 74 | 73 | 74 | 221 |
| 156 | 166 | 148 | 470 |
| 214 | 231 | 222 | 667 |
| 247 | 247 | 247 | 741 |
| 247 | 247 | 247 | 741 |
| 132 | 113 | 123 | 368 |
| 0 | 8 | 41 | 49 |
| 33 | 32 | 41 | 106 |
| 49 | 48 | 66 | 163 |
| 33 | 40 | 49 | 122 |
| 33 | 40 | 49 | 122 |
| 33 | 32 | 24 | 89 |
| 16 | 16 | 24 | 56 |
| 16 | 16 | 24 | 56 |
| 33 | 32 | 24 | 89 |
| 16 | 32 | 24 | 72 |
| 16 | 16 | 8 | 40 |
| 16 | 16 | 24 | 56 |
| 16 | 16 | 24 | 56 |
| 16 | 16 | 24 | 56 |
| 16 | 16 | 24 | 56 |
| 16 | 32 | 24 | 72 |
| 16 | 16 | 24 | 56 |
| 24 | 24 | 41 | 89 |
| 24 | 24 | 41 | 89 |
| 16 | 32 | 24 | 72 |
| 33 | 16 | 41 | 90 |
| 16 | 16 | 24 | 56 |
| 16 | 32 | 24 | 72 |
| 16 | 32 | 24 | 72 |
| 8 | 24 | 41 | 73 |
| 24 | 40 | 41 | 105 |
| 16 | 32 | 24 | 72 |
| 16 | 16 | 24 | 56 |
| 16 | 32 | 24 | 72 |
| 33 | 40 | 49 | 122 |
| 33 | 48 | 24 | 105 |
| 24 | 40 | 41 | 105 |
| 16 | 16 | 24 | 56 |
| 16 | 16 | 24 | 56 |
| 24 | 24 | 41 | 89 |
| 16 | 16 | 24 | 56 |
| 33 | 32 | 24 | 89 |
| 33 | 16 | 41 | 90 |
| 24 | 24 | 41 | 89 |
| 24 | 24 | 41 | 89 |
| 33 | 32 | 41 | 106 |
| 8 | 24 | 41 | 73 |
| 24 | 24 | 41 | 89 |
| 24 | 24 | 41 | 89 |
| 8 | 24 | 41 | 73 |
| 24 | 24 | 41 | 89 |
| 16 | 32 | 24 | 72 |
| 8 | 24 | 41 | 73 |
| 24 | 48 | 49 | 121 |
| 16 | 32 | 24 | 72 |

B 5/8

| | | | |
|---|---|---|---|
| 33 | 40 | 49 | 122 |
| 24 | 40 | 41 | 105 |
| 33 | 32 | 41 | 106 |
| 33 | 40 | 49 | 122 |
| 16 | 32 | 24 | 72 |
| 33 | 40 | 49 | 122 |
| 16 | 16 | 24 | 56 |
| 24 | 24 | 41 | 89 |
| 33 | 40 | 49 | 122 |
| 33 | 32 | 41 | 106 |
| 33 | 40 | 49 | 122 |
| 33 | 32 | 41 | 106 |
| 33 | 32 | 41 | 106 |
| 16 | 32 | 24 | 72 |
| 33 | 40 | 49 | 122 |
| 33 | 48 | 57 | 138 |
| 49 | 48 | 49 | 146 |
| 33 | 48 | 41 | 122 |
| 16 | 32 | 24 | 72 |
| 16 | 16 | 24 | 56 |
| 16 | 16 | 8 | 40 |
| 0 | 16 | 16 | 32 |
| 0 | 0 | 8 | 8 |
| 16 | 16 | 8 | 40 |
| 0 | 0 | 8 | 8 |
| 16 | 16 | 8 | 40 |
| 16 | 16 | 8 | 40 |
| 16 | 16 | 8 | 40 |
| 16 | 16 | 8 | 40 |
| 16 | 16 | 8 | 40 |
| 16 | 16 | 8 | 40 |
| 16 | 16 | 8 | 40 |
| 33 | 16 | 41 | 90 |
| 33 | 16 | 41 | 90 |
| 16 | 16 | 8 | 40 |
| 33 | 16 | 41 | 90 |
| 16 | 16 | 8 | 40 |
| 16 | 16 | 8 | 40 |
| 0 | 32 | 16 | 48 |
| 16 | 32 | 24 | 72 |
| 16 | 32 | 24 | 72 |
| 16 | 16 | 8 | 40 |
| 16 | 16 | 8 | 40 |
| 16 | 16 | 8 | 40 |
| 33 | 32 | 24 | 89 |
| 33 | 32 | 24 | 89 |
| 33 | 32 | 24 | 89 |
| 33 | 32 | 24 | 89 |
| 16 | 16 | 24 | 56 |
| 33 | 16 | 41 | 90 |
| 24 | 24 | 41 | 89 |
| 24 | 24 | 41 | 89 |
| 33 | 32 | 41 | 106 |
| 24 | 24 | 41 | 89 |
| 33 | 32 | 41 | 106 |
| 33 | 32 | 24 | 89 |
| 16 | 32 | 24 | 72 |
| 33 | 32 | 24 | 89 |
| 33 | 40 | 49 | 122 |
| 33 | 32 | 24 | 89 |
| 33 | 32 | 24 | 89 |
| 33 | 32 | 24 | 89 |
| 16 | 32 | 24 | 72 |
| 33 | 32 | 24 | 89 |
| 33 | 32 | 24 | 89 |
| 33 | 32 | 24 | 89 |
| 16 | 32 | 24 | 72 |
| 33 | 40 | 49 | 122 |
| 33 | 32 | 24 | 89 |
| 16 | 32 | 24 | 72 |
| 33 | 40 | 24 | 97 |
| 16 | 16 | 8 | 40 |
| 16 | 32 | 24 | 72 |

| 33 | 32 | 24 | 89 |
|---|---|---|---|
| 33 | 32 | 24 | 89 |
| 33 | 32 | 24 | 89 |
| 33 | 40 | 49 | 122 |
| 33 | 32 | 41 | 106 |
| 33 | 40 | 24 | 97 |
| 16 | 16 | 8 | 40 |
| 0 | 0 | 8 | 8 |
| 74 | 73 | 74 | 221 |
| 140 | 150 | 148 | 438 |
| 222 | 239 | 247 | 708 |
| 247 | 247 | 247 | 741 |
| 231 | 247 | 247 | 725 |
| 247 | 247 | 247 | 741 |
| 181 | 199 | 181 | 561 |
| 33 | 56 | 49 | 138 |
| 0 | 0 | 8 | 8 |
| 0 | 16 | 0 | 16 |
| 0 | 0 | 8 | 8 |
| 0 | 0 | 8 | 8 |
| 0 | 0 | 8 | 8 |
| 16 | 16 | 24 | 56 |
| 0 | 0 | 8 | 8 |
| 0 | 0 | 8 | 8 |
| 16 | 32 | 24 | 72 |
| 115 | 105 | 123 | 343 |
| 181 | 199 | 181 | 561 |
| 247 | 247 | 247 | 741 |
| 247 | 247 | 247 | 741 |
| 247 | 247 | 247 | 741 |
| 247 | 247 | 247 | 741 |
| 140 | 150 | 148 | 438 |
| 0 | 0 | 8 | 8 |
| 57 | 81 | 107 | 245 |
| 99 | 113 | 140 | 352 |
| 99 | 113 | 140 | 352 |
| 99 | 113 | 140 | 352 |
| 115 | 134 | 140 | 389 |
| 115 | 134 | 156 | 405 |
| 115 | 134 | 156 | 405 |
| 115 | 134 | 156 | 405 |
| 132 | 134 | 148 | 414 |
| 115 | 134 | 156 | 405 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |

| 198 | 195 | 198 | 591 |
|-----|-----|-----|-----|
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| 198 | 195 | 198 | 591 |
| | | | |
| | | | |

B 8/8

APPENDIX C

| LINE 490 | | | |
|---|---|---|---|
| R | G | B | SUM |
| 231 | 247 | 247 | 725 |
| 222 | 239 | 247 | 708 |
| 222 | 239 | 247 | 708 |
| 222 | 215 | 247 | 684 |
| 206 | 199 | 239 | 644 |
| 206 | 199 | 239 | 644 |
| 206 | 199 | 239 | 644 |
| 206 | 199 | 239 | 644 |
| 206 | 199 | 239 | 644 |
| 198 | 190 | 214 | 602 |
| 198 | 190 | 214 | 602 |
| 198 | 190 | 214 | 602 |
| 189 | 199 | 189 | 577 |
| 189 | 199 | 189 | 577 |
| 189 | 182 | 165 | 536 |
| 165 | 190 | 189 | 544 |
| 181 | 174 | 148 | 503 |
| 181 | 174 | 148 | 503 |
| 148 | 182 | 165 | 495 |
| 165 | 166 | 140 | 471 |
| 148 | 166 | 181 | 495 |
| 189 | 182 | 181 | 552 |
| 198 | 190 | 214 | 602 |
| 222 | 215 | 247 | 684 |
| 247 | 247 | 247 | 741 |
| 222 | 215 | 247 | 684 |
| 206 | 199 | 239 | 644 |
| 173 | 166 | 206 | 545 |
| 107 | 97 | 132 | 336 |
| 49 | 56 | 82 | 187 |
| 8 | 32 | 33 | 73 |
| 0 | 24 | 24 | 48 |
| 0 | 16 | 33 | 49 |
| 8 | 32 | 33 | 73 |
| 0 | 32 | 8 | 40 |
| 0 | 24 | 24 | 48 |
| 0 | 24 | 24 | 48 |
| 0 | 16 | 8 | 24 |
| 0 | 8 | 0 | 8 |
| 8 | 24 | 24 | 56 |
| 90 | 73 | 90 | 253 |
| 165 | 174 | 173 | 512 |

| LINE 495 | | | |
|---|---|---|---|
| R | G | B | SUM |
| 231 | 247 | 247 | 725 |
| 222 | 239 | 247 | 708 |
| 206 | 239 | 247 | 692 |
| 222 | 239 | 247 | 708 |
| 222 | 239 | 247 | 708 |
| 222 | 239 | 247 | 708 |
| 222 | 215 | 247 | 684 |
| 222 | 215 | 247 | 684 |
| 206 | 215 | 239 | 660 |
| 206 | 215 | 239 | 660 |
| 206 | 199 | 239 | 644 |
| 198 | 190 | 214 | 602 |
| 206 | 207 | 214 | 627 |
| 198 | 190 | 214 | 602 |
| 189 | 182 | 181 | 552 |
| 189 | 182 | 181 | 552 |
| 189 | 182 | 165 | 536 |
| 189 | 182 | 181 | 552 |
| 198 | 182 | 148 | 528 |
| 165 | 150 | 181 | 496 |
| 189 | 182 | 165 | 536 |
| 181 | 174 | 148 | 503 |
| 189 | 182 | 165 | 536 |
| 189 | 182 | 165 | 536 |
| 189 | 199 | 189 | 577 |
| 206 | 239 | 247 | 692 |
| 206 | 207 | 214 | 627 |
| 165 | 174 | 189 | 528 |
| 123 | 134 | 173 | 430 |
| 74 | 89 | 115 | 278 |
| 24 | 65 | 90 | 179 |
| 8 | 56 | 82 | 146 |
| 24 | 16 | 49 | 89 |
| 0 | 16 | 33 | 49 |
| 8 | 32 | 33 | 73 |
| 8 | 32 | 33 | 73 |
| 8 | 24 | 24 | 56 |
| 8 | 24 | 24 | 56 |
| 8 | 32 | 8 | 48 |
| 0 | 16 | 8 | 24 |
| 0 | 8 | 0 | 8 |
| 41 | 40 | 41 | 122 |

| | | | | | | | |
|---|---|---|---|---|---|---|---|
| 222 | 215 | 247 | 684 | 123 | 113 | 140 | 376 |
| 222 | 231 | 231 | 684 | 165 | 174 | 173 | 512 |
| 206 | 199 | 239 | 644 | 181 | 166 | 206 | 553 |
| 156 | 142 | 181 | 479 | 140 | 134 | 173 | 447 |
| 74 | 105 | 123 | 302 | 107 | 113 | 165 | 385 |
| 0 | 16 | 33 | 49 | 74 | 48 | 123 | 245 |
| 8 | 32 | 33 | 73 | 8 | 56 | 82 | 146 |
| 8 | 32 | 49 | 89 | 24 | 16 | 49 | 89 |
| 8 | 32 | 33 | 73 | 8 | 40 | 66 | 114 |
| 0 | 16 | 33 | 49 | 0 | 16 | 33 | 49 |
| 8 | 24 | 24 | 56 | 0 | 16 | 33 | 49 |
| 8 | 16 | 33 | 57 | 8 | 32 | 33 | 73 |
| 24 | 24 | 24 | 72 | 8 | 32 | 33 | 73 |
| 0 | 8 | 0 | 8 | 0 | 8 | 24 | 32 |
| 0 | 8 | 0 | 8 | 8 | 24 | 24 | 56 |
| 0 | 8 | 0 | 8 | 8 | 24 | 24 | 56 |
| 90 | 97 | 107 | 294 | 24 | 24 | 24 | 72 |
| 206 | 207 | 181 | 594 | 49 | 56 | 82 | 187 |
| 222 | 231 | 231 | 684 | 165 | 150 | 181 | 496 |
| 222 | 231 | 231 | 684 | 206 | 199 | 239 | 644 |
| 181 | 215 | 239 | 635 | 206 | 199 | 239 | 644 |
| 74 | 89 | 115 | 278 | 140 | 134 | 173 | 447 |
| 24 | 65 | 90 | 179 | 107 | 89 | 165 | 361 |
| 8 | 40 | 66 | 114 | 66 | 32 | 115 | 213 |
| 0 | 16 | 33 | 49 | 8 | 40 | 66 | 114 |
| 8 | 32 | 49 | 89 | 8 | 40 | 66 | 114 |
| 8 | 32 | 49 | 89 | 8 | 32 | 33 | 73 |
| 0 | 16 | 33 | 49 | 8 | 32 | 33 | 73 |
| 0 | 24 | 24 | 48 | 0 | 24 | 24 | 48 |
| 0 | 24 | 24 | 48 | 8 | 24 | 24 | 56 |
| 0 | 24 | 24 | 48 | 8 | 24 | 24 | 56 |
| 0 | 24 | 24 | 48 | 8 | 32 | 8 | 48 |
| 0 | 8 | 0 | 8 | 0 | 16 | 8 | 24 |
| 0 | 8 | 0 | 8 | 0 | 8 | 0 | 8 |
| 49 | 73 | 82 | 204 | 24 | 40 | 33 | 97 |
| 206 | 207 | 214 | 627 | 66 | 73 | 66 | 205 |
| 222 | 231 | 231 | 684 | 148 | 166 | 181 | 495 |
| 206 | 215 | 239 | 660 | 206 | 215 | 239 | 660 |
| 181 | 182 | 206 | 569 | 173 | 166 | 206 | 545 |
| 115 | 97 | 132 | 344 | 123 | 134 | 173 | 430 |
| 8 | 40 | 66 | 114 | 107 | 89 | 165 | 361 |
| 8 | 40 | 66 | 114 | 24 | 32 | 49 | 105 |
| 8 | 32 | 49 | 89 | 0 | 16 | 33 | 49 |
| 8 | 32 | 49 | 89 | 0 | 16 | 33 | 49 |

| | | | | | | | | |
|---|---|---|---|---|---|---|---|---|
| 8 | 32 | 33 | 73 | | 0 | 16 | 33 | 49 |
| 8 | 32 | 33 | 73 | | 8 | 32 | 33 | 73 |
| 0 | 16 | 33 | 49 | | 0 | 32 | 8 | 40 |
| 0 | 16 | 33 | 49 | | 0 | 32 | 8 | 40 |
| 8 | 16 | 33 | 57 | | 0 | 32 | 8 | 40 |
| 24 | 24 | 24 | 72 | | 8 | 40 | 8 | 56 |
| 8 | 16 | 33 | 57 | | 24 | 40 | 33 | 97 |
| 8 | 24 | 24 | 56 | | 0 | 8 | 0 | 8 |
| 24 | 40 | 33 | 97 | | 8 | 32 | 8 | 48 |
| 189 | 182 | 181 | 552 | | 90 | 89 | 90 | 269 |
| 247 | 247 | 247 | 741 | | 148 | 166 | 181 | 495 |
| 231 | 247 | 247 | 725 | | 222 | 231 | 231 | 684 |
| 165 | 174 | 173 | 512 | | 165 | 190 | 189 | 544 |
| 90 | 97 | 107 | 294 | | 123 | 150 | 165 | 438 |
| 8 | 65 | 90 | 163 | | 24 | 73 | 90 | 187 |
| 8 | 32 | 49 | 89 | | 8 | 40 | 66 | 114 |
| 8 | 32 | 49 | 89 | | 8 | 48 | 49 | 105 |
| 8 | 32 | 49 | 89 | | 8 | 32 | 33 | 73 |
| 0 | 32 | 8 | 40 | | 0 | 24 | 24 | 48 |
| 0 | 16 | 8 | 24 | | 16 | 56 | 8 | 80 |
| 0 | 16 | 8 | 24 | | 8 | 24 | 24 | 56 |
| 0 | 24 | 24 | 48 | | 8 | 32 | 33 | 73 |
| 0 | 24 | 24 | 48 | | 8 | 24 | 24 | 56 |
| 0 | 16 | 8 | 24 | | 8 | 24 | 24 | 56 |
| 8 | 24 | 24 | 56 | | 24 | 40 | 33 | 97 |
| 0 | 8 | 0 | 8 | | 0 | 8 | 0 | 8 |
| 0 | 8 | 0 | 8 | | 0 | 8 | 0 | 8 |
| 115 | 121 | 115 | 351 | | 57 | 56 | 66 | 179 |
| 222 | 215 | 247 | 684 | | 140 | 134 | 107 | 381 |
| 247 | 247 | 247 | 741 | | 198 | 190 | 214 | 602 |
| 181 | 199 | 214 | 594 | | 198 | 190 | 214 | 602 |
| 107 | 113 | 165 | 385 | | 156 | 174 | 206 | 536 |
| 24 | 65 | 90 | 179 | | 74 | 48 | 123 | 245 |
| 8 | 56 | 82 | 146 | | 49 | 16 | 82 | 147 |
| 8 | 32 | 49 | 89 | | 8 | 32 | 49 | 89 |
| 8 | 32 | 49 | 89 | | 8 | 32 | 49 | 89 |
| 0 | 16 | 8 | 24 | | 8 | 32 | 33 | 73 |
| 0 | 24 | 24 | 48 | | 8 | 48 | 49 | 105 |
| 0 | 16 | 8 | 24 | | 24 | 40 | 33 | 97 |
| 0 | 16 | 8 | 24 | | 8 | 24 | 24 | 56 |
| 24 | 24 | 24 | 72 | | 0 | 16 | 8 | 24 |
| 0 | 8 | 0 | 8 | | 8 | 32 | 8 | 48 |
| 0 | 8 | 0 | 8 | | 24 | 24 | 24 | 72 |
| 0 | 8 | 0 | 8 | | 24 | 24 | 24 | 72 |

| | | | |
|---|---|---|---|
| 0 | 8 | 0 | 8 |
| 74 | 89 | 66 | 229 |
| 247 | 247 | 247 | 741 |
| 247 | 247 | 247 | 741 |
| 206 | 207 | 214 | 627 |
| 99 | 73 | 99 | 271 |
| 24 | 40 | 66 | 130 |
| 49 | 32 | 90 | 171 |
| 8 | 40 | 66 | 114 |
| 24 | 16 | 49 | 89 |
| 8 | 32 | 49 | 89 |
| 0 | 16 | 33 | 49 |
| 0 | 24 | 24 | 48 |
| 0 | 16 | 8 | 24 |
| 0 | 32 | 8 | 40 |
| 8 | 32 | 33 | 73 |
| 0 | 16 | 8 | 24 |
| 0 | 8 | 0 | 8 |
| 0 | 8 | 0 | 8 |
| 24 | 40 | 33 | 97 |
| 189 | 182 | 165 | 536 |
| 222 | 231 | 231 | 684 |
| 206 | 239 | 247 | 692 |
| 115 | 97 | 132 | 344 |
| 8 | 32 | 49 | 89 |
| 49 | 40 | 82 | 171 |
| 24 | 40 | 66 | 130 |
| 8 | 32 | 49 | 89 |
| 8 | 32 | 33 | 73 |
| 0 | 24 | 24 | 48 |
| 8 | 24 | 24 | 56 |
| 8 | 24 | 24 | 56 |
| 0 | 8 | 0 | 8 |
| 41 | 32 | 41 | 114 |
| 0 | 16 | 8 | 24 |
| 8 | 40 | 8 | 56 |
| 24 | 40 | 33 | 97 |
| 41 | 32 | 41 | 114 |
| 41 | 32 | 41 | 114 |
| 8 | 32 | 8 | 48 |
| 24 | 24 | 24 | 72 |
| 41 | 32 | 41 | 114 |
| 24 | 24 | 24 | 72 |
| 8 | 24 | 24 | 56 |

| | | | |
|---|---|---|---|
| 0 | 8 | 0 | 8 |
| 57 | 40 | 66 | 163 |
| 165 | 174 | 173 | 512 |
| 206 | 199 | 181 | 586 |
| 222 | 231 | 231 | 684 |
| 156 | 150 | 165 | 471 |
| 74 | 89 | 90 | 253 |
| 0 | 24 | 24 | 48 |
| 8 | 32 | 33 | 73 |
| 8 | 48 | 49 | 105 |
| 24 | 40 | 33 | 97 |
| 8 | 32 | 33 | 73 |
| 24 | 24 | 24 | 72 |
| 24 | 40 | 33 | 97 |
| 8 | 40 | 8 | 56 |
| 41 | 56 | 41 | 138 |
| 24 | 40 | 33 | 97 |
| 8 | 32 | 33 | 73 |
| 0 | 16 | 8 | 24 |
| -8 | 24 | 24 | 56 |
| 148 | 166 | 181 | 495 |
| 206 | 207 | 214 | 627 |
| 206 | 215 | 239 | 660 |
| 123 | 134 | 140 | 397 |
| 74 | 89 | 115 | 278 |
| 49 | 40 | 82 | 171 |
| 24 | 32 | 49 | 105 |
| 24 | 48 | 49 | 121 |
| 24 | 40 | 33 | 97 |
| 24 | 40 | 33 | 97 |
| 41 | 40 | 41 | 122 |
| 24 | 40 | 33 | 97 |
| 41 | 40 | 41 | 122 |
| 41 | 56 | 41 | 138 |
| 41 | 56 | 41 | 138 |
| 41 | 40 | 41 | 122 |
| 41 | 56 | 41 | 138 |
| 41 | 56 | 57 | 154 |
| 41 | 56 | 41 | 138 |
| 41 | 56 | 57 | 154 |
| 41 | 56 | 57 | 154 |
| 41 | 65 | 66 | 172 |
| 57 | 56 | 66 | 179 |
| 57 | 56 | 66 | 179 |

| | | | |
|---|---|---|---|
| 0 | 8 | 0 | 8 |
| 99 | 121 | 99 | 319 |
| 140 | 142 | 140 | 422 |
| 148 | 142 | 140 | 430 |
| 90 | 97 | 107 | 294 |
| 41 | 56 | 57 | 154 |
| 49 | 56 | 82 | 187 |
| 41 | 56 | 57 | 154 |
| 41 | 32 | 57 | 130 |
| 41 | 40 | 57 | 138 |
| 24 | 40 | 33 | 97 |
| 24 | 24 | 24 | 72 |
| 24 | 40 | 33 | 97 |
| 24 | 24 | 24 | 72 |
| 41 | 32 | 41 | 114 |
| 8 | 40 | 8 | 56 |
| 41 | 32 | 41 | 114 |
| 41 | 32 | 41 | 114 |
| 41 | 32 | 41 | 114 |
| 41 | 40 | 41 | 122 |
| 41 | 32 | 41 | 114 |
| 8 | 40 | 8 | 56 |
| 24 | 40 | 33 | 97 |
| 24 | 40 | 33 | 97 |
| 24 | 40 | 33 | 97 |
| 24 | 40 | 33 | 97 |
| 24 | 40 | 33 | 97 |
| 24 | 40 | 33 | 97 |
| 24 | 40 | 33 | 97 |
| 24 | 48 | 49 | 121 |
| 24 | 48 | 49 | 121 |
| 24 | 48 | 49 | 121 |
| 24 | 40 | 33 | 97 |
| 24 | 40 | 33 | 97 |
| 41 | 56 | 41 | 138 |
| 41 | 56 | 41 | 138 |
| 41 | 56 | 41 | 138 |
| 41 | 40 | 41 | 122 |
| 57 | 56 | 49 | 162 |
| 41 | 40 | 41 | 122 |
| 41 | 40 | 57 | 138 |
| 41 | 56 | 57 | 154 |
| 41 | 40 | 57 | 138 |

| | | | |
|---|---|---|---|
| 66 | 56 | 82 | 204 |
| 57 | 56 | 66 | 179 |
| 74 | 40 | 82 | 196 |
| 74 | 40 | 82 | 196 |
| 74 | 24 | 90 | 188 |
| 66 | 8 | 82 | 156 |
| 66 | 56 | 82 | 204 |
| 140 | 105 | 140 | 385 |
| 247 | 247 | 247 | 741 |
| 206 | 215 | 239 | 660 |
| 181 | 150 | 214 | 545 |
| 90 | 73 | 115 | 278 |
| 49 | 56 | 82 | 187 |
| 49 | 56 | 82 | 187 |
| 57 | 73 | 90 | 220 |
| 57 | 73 | 90 | 220 |
| 49 | 73 | 82 | 204 |
| 49 | 73 | 82 | 204 |
| 66 | 73 | 66 | 205 |
| 41 | 65 | 66 | 172 |
| 41 | 56 | 57 | 154 |
| 41 | 56 | 57 | 154 |
| 41 | 65 | 41 | 147 |
| 24 | 40 | 33 | 97 |
| 24 | 40 | 33 | 97 |
| 41 | 56 | 41 | 138 |
| 41 | 56 | 57 | 154 |
| 41 | 56 | 41 | 138 |
| 41 | 65 | 66 | 172 |
| 41 | 65 | 66 | 172 |
| 57 | 73 | 66 | 196 |
| 66 | 73 | 66 | 205 |
| 57 | 73 | 66 | 196 |
| 49 | 73 | 82 | 204 |
| 49 | 73 | 82 | 204 |
| 57 | 73 | 66 | 196 |
| 66 | 56 | 82 | 204 |
| 66 | 73 | 66 | 205 |
| 49 | 73 | 82 | 204 |
| 49 | 73 | 82 | 204 |
| 57 | 73 | 66 | 196 |
| 57 | 56 | 66 | 179 |
| 41 | 65 | 66 | 172 |
| 41 | 65 | 66 | 172 |

| | | | |
|---|---|---|---|
| 24 | 40 | 33 | 97 |
| 24 | 48 | 49 | 121 |
| 24 | 40 | 33 | 97 |
| 8 | 24 | 24 | 56 |
| 0 | 8 | 0 | 8 |
| 74 | 97 | 99 | 270 |
| 165 | 174 | 173 | 512 |
| 189 | 199 | 189 | 577 |
| 165 | 174 | 173 | 512 |
| 57 | 56 | 66 | 179 |
| 49 | 56 | 82 | 187 |
| 74 | 56 | 99 | 229 |
| 41 | 40 | 57 | 138 |
| 24 | 40 | 66 | 130 |
| 8 | 32 | 33 | 73 |
| 24 | 32 | 49 | 105 |
| 24 | 40 | 33 | 97 |
| 24 | 40 | 33 | 97 |
| 24 | 40 | 33 | 97 |
| 24 | 24 | 24 | 72 |
| 8 | 24 | 24 | 56 |
| 0 | 8 | 0 | 8 |
| 41 | 40 | 41 | 122 |
| 107 | 97 | 90 | 294 |
| 189 | 182 | 181 | 552 |
| 156 | 150 | 165 | 471 |
| 140 | 105 | 140 | 385 |
| 99 | 56 | 115 | 270 |
| 49 | 56 | 82 | 187 |
| 49 | 56 | 82 | 187 |
| 49 | 56 | 82 | 187 |
| 49 | 40 | 82 | 171 |
| 24 | 40 | 33 | 97 |
| 24 | 32 | 49 | 105 |
| 24 | 40 | 33 | 97 |
| 24 | 24 | 24 | 72 |
| 8 | 24 | 24 | 56 |
| 8 | 32 | 8 | 48 |
| 24 | 40 | 33 | 97 |
| 24 | 24 | 24 | 72 |
| 24 | 40 | 33 | 97 |
| 8 | 32 | 33 | 73 |
| 24 | 24 | 24 | 72 |
| 8 | 32 | 33 | 73 |

| | | | |
|---|---|---|---|
| 41 | 65 | 66 | 172 |
| 57 | 89 | 66 | 212 |
| 41 | 65 | 66 | 172 |
| 24 | 48 | 49 | 121 |
| 41 | 65 | 66 | 172 |
| 132 | 166 | 165 | 463 |
| 247 | 247 | 247 | 741 |
| 206 | 207 | 181 | 594 |
| 123 | 150 | 165 | 438 |
| 24 | 65 | 66 | 155 |
| 8 | 56 | 66 | 130 |
| 8 | 65 | 90 | 163 |
| 24 | 48 | 49 | 121 |
| 24 | 48 | 49 | 121 |
| 24 | 40 | 33 | 97 |
| 24 | 40 | 33 | 97 |
| 24 | 48 | 49 | 121 |
| 41 | 65 | 41 | 147 |
| 41 | 56 | 57 | 154 |
| 41 | 40 | 57 | 138 |
| 24 | 24 | 24 | 72 |
| 8 | 16 | 33 | 57 |
| 115 | 121 | 115 | 351 |
| 189 | 182 | 181 | 552 |
| 222 | 215 | 247 | 684 |
| 189 | 182 | 181 | 552 |
| 90 | 73 | 99 | 262 |
| 57 | 40 | 66 | 163 |
| 41 | 40 | 57 | 138 |
| 41 | 40 | 57 | 138 |
| 24 | 40 | 33 | 97 |
| 24 | 32 | 49 | 105 |
| 41 | 32 | 41 | 114 |
| 24 | 24 | 24 | 72 |
| 24 | 40 | 33 | 97 |
| 24 | 40 | 33 | 97 |
| 8 | 24 | 24 | 56 |
| 24 | 24 | 24 | 72 |
| 24 | 40 | 33 | 97 |
| 24 | 24 | 24 | 72 |
| 24 | 24 | 24 | 72 |
| 24 | 40 | 33 | 97 |
| 24 | 24 | 24 | 72 |
| 24 | 40 | 33 | 97 |

| | | | | | | | |
|---|---|---|---|---|---|---|---|
| 8 | 16 | 33 | 57 | 24 | 24 | 24 | 72 |
| 8 | 24 | 24 | 56 | 24 | 40 | 33 | 97 |
| 0 | 24 | 24 | 48 | 8 | 24 | 24 | 56 |
| 0 | 24 | 24 | 48 | 24 | 24 | 24 | 72 |
| 8 | 24 | 24 | 56 | 24 | 40 | 33 | 97 |
| 8 | 32 | 33 | 73 | 24 | 40 | 33 | 97 |
| 8 | 16 | 33 | 57 | 8 | 32 | 33 | 73 |
| 8 | 24 | 24 | 56 | 24 | 24 | 24 | 72 |
| 8 | 24 | 24 | 56 | 24 | 40 | 33 | 97 |
| 8 | 32 | 33 | 73 | 24 | 48 | 49 | 121 |
| 24 | 24 | 24 | 72 | 24 | 48 | 49 | 121 |
| 8 | 32 | 33 | 73 | 8 | 32 | 33 | 73 |
| 8 | 32 | 33 | 73 | 0 | 24 | 24 | 48 |
| 0 | 8 | 24 | 32 | 0 | 16 | 8 | 24 |
| 57 | 56 | 66 | 179 | 49 | 113 | 90 | 252 |
| 165 | 174 | 189 | 528 | 222 | 215 | 206 | 643 |
| 222 | 231 | 231 | 684 | 222 | 231 | 231 | 684 |
| 222 | 231 | 231 | 684 | 189 | 199 | 189 | 577 |
| 90 | 97 | 107 | 294 | 66 | 73 | 66 | 205 |
| 41 | 40 | 57 | 138 | 0 | 32 | 8 | 40 |
| 41 | 65 | 66 | 172 | 8 | 32 | 33 | 73 |
| 41 | 56 | 57 | 154 | 8 | 24 | 24 | 56 |
| 8 | 32 | 33 | 73 | 0 | 24 | 24 | 48 |
| 0 | 24 | 24 | 48 | 0 | 24 | 24 | 48 |
| 0 | 16 | 33 | 49 | 8 | 32 | 33 | 73 |
| 0 | 24 | 24 | 48 | 8 | 32 | 33 | 73 |
| 0 | 16 | 33 | 49 | 8 | 32 | 33 | 73 |
| 8 | 32 | 33 | 73 | 0 | 24 | 24 | 48 |
| 8 | 24 | 24 | 56 | 8 | 24 | 24 | 56 |
| 8 | 24 | 24 | 56 | 8 | 32 | 33 | 73 |
| 0 | 16 | 8 | 24 | 8 | 24 | 24 | 56 |
| 8 | 32 | 8 | 48 | 0 | 32 | 8 | 40 |
| 0 | 16 | 8 | 24 | 0 | 32 | 8 | 40 |
| 8 | 40 | 8 | 56 | 0 | 32 | 8 | 40 |
| 8 | 24 | 24 | 56 | 0 | 24 | 24 | 48 |
| 24 | 24 | 24 | 72 | 0 | 16 | 8 | 24 |
| 8 | 24 | 24 | 56 | 0 | 8 | 0 | 8 |
| 0 | 8 | 0 | 8 | 0 | 16 | 33 | 49 |
| 8 | 24 | 24 | 56 | 90 | 113 | 99 | 302 |
| 8 | 24 | 24 | 56 | 165 | 174 | 189 | 528 |
| 8 | 16 | 33 | 57 | 198 | 190 | 214 | 602 |
| 8 | 16 | 33 | 57 | 107 | 113 | 132 | 352 |
| 0 | 8 | 0 | 8 | 24 | 24 | 24 | 72 |
| 57 | 56 | 49 | 162 | 24 | 32 | 49 | 105 |

| | | | |
|---|---|---|---|
| 123 | 134 | 140 | 397 |
| 222 | 231 | 231 | 684 |
| 165 | 166 | 140 | 471 |
| 57 | 73 | 49 | 179 |
| 24 | 48 | 49 | 121 |
| 8 | 32 | 33 | 73 |
| 8 | 48 | 49 | 105 |
| 0 | 24 | 24 | 48 |
| 8 | 32 | 33 | 73 |
| 0 | 32 | 8 | 40 |
| 0 | 16 | 33 | 49 |
| 0 | 24 | 24 | 48 |
| 0 | 8 | 0 | 8 |
| 0 | 8 | 24 | 32 |
| 0 | 8 | 0 | 8 |
| 0 | 24 | 24 | 48 |
| 0 | 24 | 24 | 48 |
| 0 | 16 | 33 | 49 |
| 8 | 32 | 33 | 73 |
| 8 | 16 | 33 | 57 |
| 8 | 16 | 33 | 57 |
| 0 | 8 | 0 | 8 |
| 0 | 8 | 0 | 8 |
| 24 | 24 | 24 | 72 |
| 0 | 8 | 0 | 8 |
| 24 | 24 | 24 | 72 |
| 0 | 8 | 0 | 8 |
| 0 | 16 | 8 | 24 |
| 8 | 24 | 24 | 56 |
| 0 | 8 | 24 | 32 |
| 0 | 16 | 8 | 24 |
| 0 | 16 | 8 | 24 |
| 0 | 16 | 8 | 24 |
| 0 | 32 | 8 | 40 |
| 0 | 16 | 8 | 24 |
| 0 | 16 | 8 | 24 |
| 0 | 16 | 8 | 24 |
| 0 | 16 | 8 | 24 |
| 8 | 16 | 33 | 57 |
| 0 | 16 | 33 | 49 |
| 0 | 8 | 0 | 8 |
| 0 | 8 | 0 | 8 |
| 90 | 113 | 99 | 302 |
| 247 | 247 | 247 | 741 |

| | | | |
|---|---|---|---|
| 24 | 32 | 49 | 105 |
| 24 | 40 | 33 | 97 |
| 8 | 32 | 33 | 73 |
| 8 | 24 | 24 | 56 |
| 8 | 32 | 33 | 73 |
| 8 | 16 | 33 | 57 |
| 0 | 8 | 24 | 32 |
| 0 | 16 | 33 | 49 |
| 0 | 32 | 8 | 40 |
| 0 | 32 | 8 | 40 |
| 0 | 24 | 24 | 48 |
| 16 | 56 | 8 | 80 |
| 0 | 24 | 24 | 48 |
| 0 | 32 | 8 | 40 |
| 0 | 24 | 24 | 48 |
| 0 | 24 | 24 | 48 |
| 0 | 32 | 8 | 40 |
| 0 | 16 | 8 | 24 |
| 0 | 24 | 24 | 48 |
| 0 | 24 | 24 | 48 |
| 8 | 32 | 8 | 48 |
| 0 | 32 | 8 | 40 |
| 0 | 16 | 8 | 24 |
| 0 | 16 | 8 | 24 |
| 8 | 24 | 24 | 56 |
| 8 | 24 | 24 | 56 |
| 0 | 8 | 0 | 8 |
| 0 | 8 | 0 | 8 |
| 0 | 32 | 8 | 40 |
| 0 | 16 | 8 | 24 |
| 0 | 16 | 8 | 24 |
| 0 | 8 | 0 | 8 |
| 0 | 16 | 8 | 24 |
| 0 | 16 | 8 | 24 |
| 0 | 16 | 8 | 24 |
| 0 | 16 | 8 | 24 |
| 0 | 24 | 24 | 48 |
| 0 | 24 | 24 | 48 |
| 8 | 32 | 33 | 73 |
| 0 | 8 | 24 | 32 |
| 24 | 32 | 49 | 105 |
| 107 | 113 | 132 | 352 |
| 189 | 199 | 189 | 577 |
| 222 | 215 | 247 | 684 |

| | | | |
|---|---|---|---|
| 247 | 247 | 247 | 741 |
| 189 | 199 | 189 | 577 |
| 41 | 65 | 41 | 147 |
| 8 | 40 | 8 | 56 |
| 0 | 32 | 8 | 40 |
| 0 | 32 | 8 | 40 |
| 0 | 32 | 8 | 40 |
| 0 | 32 | 8 | 40 |
| 0 | 16 | 8 | 24 |
| 0 | 8 | 0 | 8 |
| 0 | 8 | 0 | 8 |
| 8 | 24 | 24 | 56 |
| 0 | 8 | 0 | 8 |
| 0 | 8 | 0 | 8 |
| 0 | 8 | 0 | 8 |
| 90 | 113 | 99 | 302 |
| 189 | 182 | 165 | 536 |
| 222 | 231 | 231 | 684 |
| 206 | 207 | 181 | 594 |
| 140 | 134 | 107 | 381 |
| 41 | 32 | 41 | 114 |
| 0 | 8 | 0 | 8 |
| 8 | 24 | 24 | 56 |
| 0 | 8 | 0 | 8 |
| 0 | 8 | 0 | 8 |
| 0 | 8 | 0 | 8 |
| 0 | 16 | 8 | 24 |
| 0 | 16 | 8 | 24 |
| 0 | 16 | 8 | 24 |
| 0 | 8 | 24 | 32 |
| 0 | 8 | 0 | 8 |
| 8 | 24 | 24 | 56 |
| 24 | 40 | 33 | 97 |
| 140 | 142 | 140 | 422 |
| 247 | 247 | 247 | 741 |
| 222 | 231 | 231 | 684 |
| 165 | 150 | 181 | 496 |
| 41 | 32 | 41 | 114 |
| 0 | 8 | 0 | 8 |
| 8 | 24 | 24 | 56 |
| 8 | 24 | 24 | 56 |
| 8 | 24 | 24 | 56 |
| 0 | 16 | 8 | 24 |
| 0 | 16 | 8 | 24 |

| | | | |
|---|---|---|---|
| 189 | 182 | 165 | 536 |
| 90 | 97 | 107 | 294 |
| 24 | 24 | 24 | 72 |
| 0 | 8 | 0 | 8 |
| 0 | 32 | 8 | 40 |
| 0 | 16 | 8 | 24 |
| 0 | 32 | 8 | 40 |
| 0 | 16 | 8 | 24 |
| 0 | 32 | 8 | 40 |
| 0 | 16 | 8 | 24 |
| 0 | 8 | 0 | 8 |
| 0 | 16 | 8 | 24 |
| 0 | 8 | 0 | 8 |
| 57 | 73 | 66 | 196 |
| 140 | 142 | 140 | 422 |
| 206 | 239 | 247 | 692 |
| 222 | 215 | 206 | 643 |
| 123 | 134 | 140 | 397 |
| 57 | 40 | 66 | 163 |
| 0 | 8 | 0 | 8 |
| 0 | 8 | 0 | 8 |
| 0 | 8 | 0 | 8 |
| 0 | 8 | 0 | 8 |
| 8 | 24 | 24 | 56 |
| 8 | 16 | 33 | 57 |
| 0 | 8 | 24 | 32 |
| 0 | 8 | 0 | 8 |
| 8 | 24 | 24 | 56 |
| 0 | 8 | 0 | 8 |
| 0 | 8 | 0 | 8 |
| 66 | 73 | 66 | 205 |
| 140 | 142 | 140 | 422 |
| 222 | 231 | 231 | 684 |
| 206 | 207 | 214 | 627 |
| 189 | 182 | 165 | 536 |
| 57 | 56 | 49 | 162 |
| 0 | 8 | 0 | 8 |
| 0 | 16 | 8 | 24 |
| 0 | 16 | 8 | 24 |
| 0 | 16 | 8 | 24 |
| 0 | 16 | 8 | 24 |
| 0 | 16 | 8 | 24 |
| 0 | 16 | 8 | 24 |
| 0 | 24 | 24 | 48 |

| | | | | | | | | |
|---|---|---|---|---|---|---|---|---|
| 0 | 16 | 8 | 24 | | 8 | 16 | 33 | 57 |
| 0 | 8 | 0 | 8 | | 8 | 24 | 24 | 56 |
| 0 | 16 | 8 | 24 | | 8 | 24 | 24 | 56 |
| 0 | 24 | 24 | 48 | | 8 | 24 | 24 | 56 |
| 0 | 8 | 24 | 32 | | 24 | 24 | 24 | 72 |
| 0 | 8 | 24 | 32 | | 24 | 24 | 24 | 72 |
| 0 | 8 | 24 | 32 | | 0 | 16 | 8 | 24 |
| 0 | 8 | 0 | 8 | | 0 | 16 | 8 | 24 |
| 0 | 8 | 0 | 8 | | 0 | 16 | 8 | 24 |
| 0 | 8 | 0 | 8 | | 8 | 32 | 8 | 48 |
| 0 | 8 | 0 | 8 | | 8 | 24 | 24 | 56 |
| 0 | 8 | 0 | 8 | | 0 | 8 | 0 | 8 |
| 0 | 8 | 0 | 8 | | 0 | 16 | 8 | 24 |
| 8 | 16 | 33 | 57 | | 0 | 16 | 8 | 24 |
| 8 | 16 | 33 | 57 | | 0 | 24 | 24 | 48 |
| 0 | 8 | 0 | 8 | | 0 | 16 | 8 | 24 |
| 0 | 8 | 0 | 8 | | 0 | 8 | 24 | 32 |
| 0 | 16 | 8 | 24 | | 0 | 24 | 24 | 48 |
| 0 | 16 | 8 | 24 | | 0 | 16 | 8 | 24 |
| 0 | 8 | 0 | 8 | | 0 | 8 | 0 | 8 |
| 0 | 8 | 0 | 8 | | 0 | 16 | 8 | 24 |
| 0 | 8 | 0 | 8 | | 8 | 24 | 24 | 56 |
| 0 | 8 | 0 | 8 | | 0 | 8 | 0 | 8 |
| 0 | 8 | 0 | 8 | | 0 | 16 | 8 | 24 |
| 0 | 8 | 0 | 8 | | 0 | 8 | 0 | 8 |
| 0 | 8 | 0 | 8 | | 0 | 8 | 0 | 8 |
| 0 | 8 | 0 | 8 | | 0 | 8 | 0 | 8 |
| 0 | 16 | 8 | 24 | | 0 | 16 | 8 | 24 |
| 0 | 16 | 8 | 24 | | 0 | 16 | 8 | 24 |
| 0 | 16 | 8 | 24 | | 0 | 16 | 8 | 24 |
| 0 | 32 | 8 | 40 | | 0 | 8 | 24 | 32 |
| 0 | 16 | 8 | 24 | | 0 | 8 | 0 | 8 |
| 0 | 24 | 24 | 48 | | 0 | 8 | 0 | 8 |
| 0 | 8 | 24 | 32 | | 8 | 16 | 33 | 57 |
| 0 | 16 | 33 | 49 | | 8 | 16 | 33 | 57 |
| 0 | 8 | 0 | 8 | | 0 | 8 | 0 | 8 |
| 0 | 16 | 33 | 49 | | 8 | 32 | 33 | 73 |
| 0 | 16 | 33 | 49 | | 57 | 56 | 66 | 179 |
| 0 | 8 | 24 | 32 | | 140 | 142 | 140 | 422 |
| 41 | 40 | 57 | 138 | | 189 | 199 | 189 | 577 |
| 90 | 113 | 99 | 302 | | 247 | 247 | 247 | 741 |
| 206 | 207 | 214 | 627 | | 206 | 207 | 214 | 627 |
| 247 | 247 | 247 | 741 | | 148 | 142 | 140 | 430 |
| 247 | 247 | 247 | 741 | | 24 | 16 | 49 | 89 |

| | | | | | | | | |
|---|---|---|---|---|---|---|---|---|
| 148 | 142 | 140 | 430 | | 0 | 8 | 0 | 8 |
| 0 | 8 | 0 | 8 | | 0 | 8 | 0 | 8 |
| 0 | 8 | 0 | 8 | | 0 | 8 | 0 | 8 |
| 0 | 8 | 0 | 8 | | 0 | 16 | 8 | 24 |
| 0 | 32 | 8 | 40 | | 0 | 16 | 8 | 24 |
| 0 | 16 | 8 | 24 | | 0 | 8 | 0 | 8 |
| 0 | 8 | 0 | 8 | | 0 | 8 | 0 | 8 |
| 0 | 8 | 0 | 8 | | 0 | 8 | 0 | 8 |
| 0 | 8 | 24 | 32 | | 0 | 8 | 24 | 32 |
| 8 | 24 | 24 | 56 | | 24 | 40 | 66 | 130 |
| 8 | 16 | 33 | 57 | | 66 | 105 | 90 | 261 |
| 0 | 8 | 0 | 8 | | 123 | 150 | 165 | 438 |
| 57 | 73 | 49 | 179 | | 206 | 207 | 214 | 627 |
| 123 | 150 | 148 | 421 | | 231 | 247 | 247 | 725 |
| 222 | 215 | 206 | 643 | | 222 | 231 | 231 | 684 |
| 231 | 247 | 247 | 725 | | 189 | 182 | 165 | 536 |
| 247 | 247 | 247 | 741 | | 115 | 97 | 132 | 344 |
| 148 | 158 | 132 | 438 | | 107 | 97 | 90 | 294 |
| 41 | 89 | 41 | 171 | | 66 | 73 | 66 | 205 |

What is claimed is:

1. A method for detecting a wafer in a wafer carrier, comprising:

acquiring an image of a carrier having a plurality of slots, said carrier including at least one wafer;

recognizing a first feature of the at least one wafer in a first column of the image;

determining a first position in the first column of the image where the first feature is detected, said first position corresponding to a first reference slot of said plurality of slots;

recognizing a second feature of the at least one wafer in a second column of the image;

determining a second position in the second column of the image where the second feature is detected, said second position corresponding to a second reference slot of said plurality of slots; and comparing said first reference slot to said second reference slot to determine if said first reference slot is the same or different from said second reference slot.

2. The method of claim 1 wherein the first feature is represented as peak intensity in the first column and the second feature is represented as peak intensity in the second column.

3. The method of claim 1 wherein the image is acquired using a camera.

4. The method of claim 3 wherein the camera is a video camera.

5. The method of claim 3 wherein the camera is a digital camera.

6. The method of claim 5 wherein the image is a digitized image.

7. In a semiconductor manufacturing equipment, a wafer mapping apparatus comprising:

a camera for acquiring an image of a wafer contained in a carrier, said carrier including a plurality of slots for supporting wafers therein;

means for recognizing a first feature of the wafer in a first column of the image;

means for determining a first position in the first column of the image where the first feature is detected, said first position corresponding to a first reference slot of said plurality of slots;

means for recognizing a second feature of the wafer in a second column of the image;

means for determining a second position in the second column of the image where the second feature is detected, said second position corresponding to a second reference slot of said plurality of slots; and means for comparing said first reference slot to said second reference slot to determine if said first reference slot is the same or different from said second reference slot.

8. The apparatus of claim 7 further comprising a light source.

9. The apparatus of claim 7 wherein the camera is a video camera.

10. The apparatus of claim 7 wherein the camera is a digital camera.

11. The apparatus of claim 7 wherein the camera is coupled to a display monitor.

12. The apparatus of claim 7 wherein the feature of the wafer is detected in a column of the image.

* * * * *